United States Patent
Nakanishi

(10) Patent No.: US 11,275,322 B2
(45) Date of Patent: Mar. 15, 2022

(54) SEMICONDUCTOR LIGHT EMITTING DEVICE HAVING A SHIFT THYRISTER WITH A LAMINATED STRUCTURE, EXPOSURE HEAD, AND IMAGE FORMING APPARATUS

(71) Applicant: CANON KABUSHIKI KAISHA, Tokyo (JP)

(72) Inventor: Koichiro Nakanishi, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/021,322

(22) Filed: Sep. 15, 2020

(65) Prior Publication Data

US 2021/0088928 A1 Mar. 25, 2021

(30) Foreign Application Priority Data

Sep. 25, 2019 (JP) .............................. JP2019-173829

(51) Int. Cl.
*G03G 15/00* (2006.01)
*G03G 15/04* (2006.01)

(52) U.S. Cl.
CPC ....... *G03G 15/04054* (2013.01); *G03G 15/80* (2013.01)

(58) Field of Classification Search
USPC .......................................... 399/107; 358/300
See application file for complete search history.

(56) References Cited

U.S. PATENT DOCUMENTS

| 9,013,527 | B2 | 4/2015 | Ohno | |
| 9,513,106 | B2 | 12/2016 | Nakanishi | .......... G01B 9/02069 |
| 2014/0320577 | A1 | 10/2014 | Ohno | |
| 2018/0062041 | A1* | 3/2018 | Nakanishi | .............. H04N 1/036 |

FOREIGN PATENT DOCUMENTS

| JP | 2014-216505 A | 11/2014 |
| JP | 2016-51815 A | 4/2016 |

* cited by examiner

*Primary Examiner* — Quana Grainger
(74) *Attorney, Agent, or Firm* — Venable LLP

(57) ABSTRACT

Provided is a semiconductor light emitting device including nodes each connected to a gate of a shift thyristor and a gate of a light emitting thyristor and transfer diodes arranged to connect the nodes to each other. The shift thyristor has a laminated structure including semiconductor layers, and is provided to a mesa formed separately from the light emitting thyristors and the transfer diodes. The shift thyristor includes a first metal layer continuously provided to straddle the mesa, and a second metal layer, which is arranged in an upper layer than the first metal layer, and includes a first part and a second part arranged to be opposed to the first part across the mesa. The first part and the second part of the second metal layer are each electrically connected to the first metal layer in a region that does not overlap the mesa in a plan view.

19 Claims, 15 Drawing Sheets

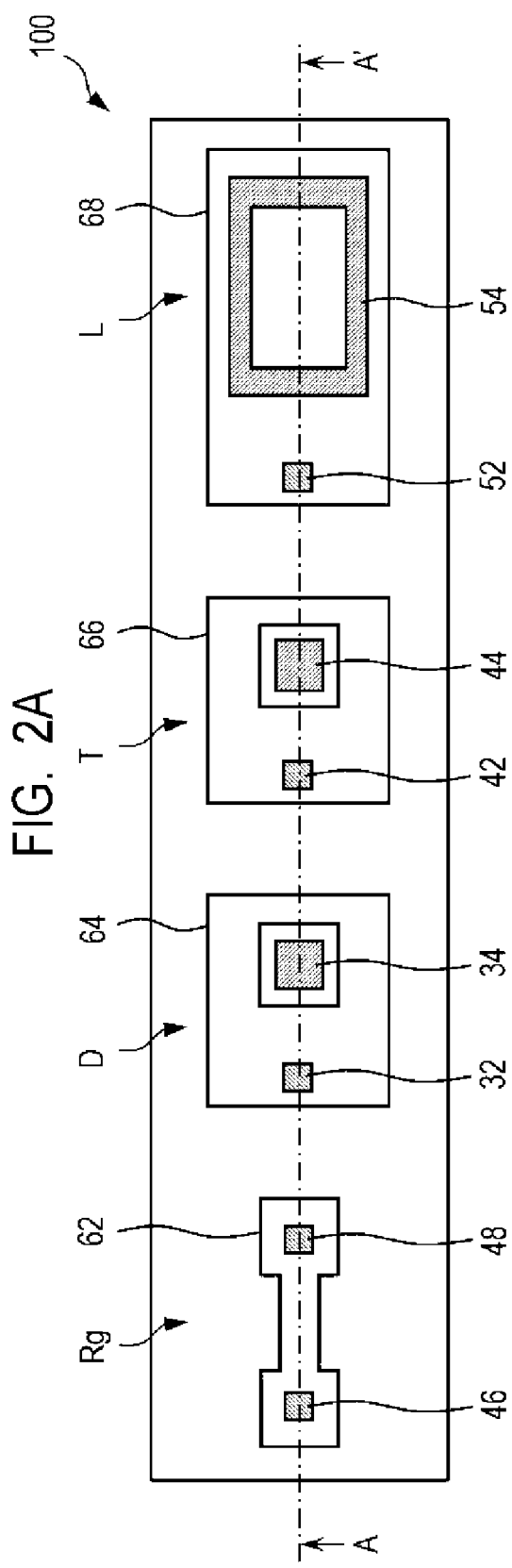
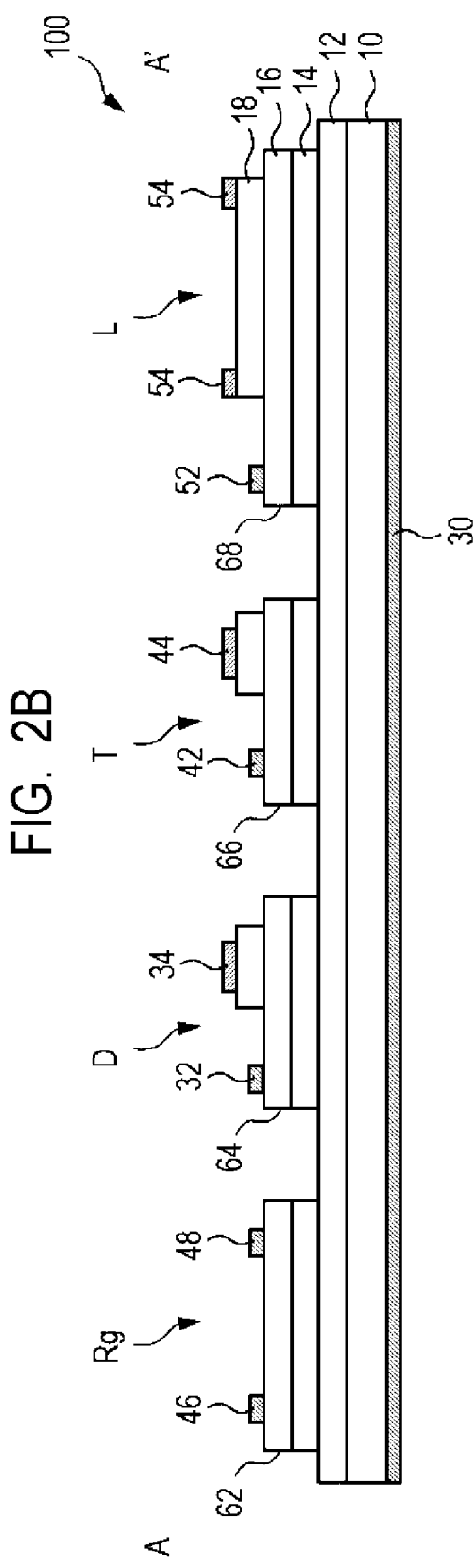

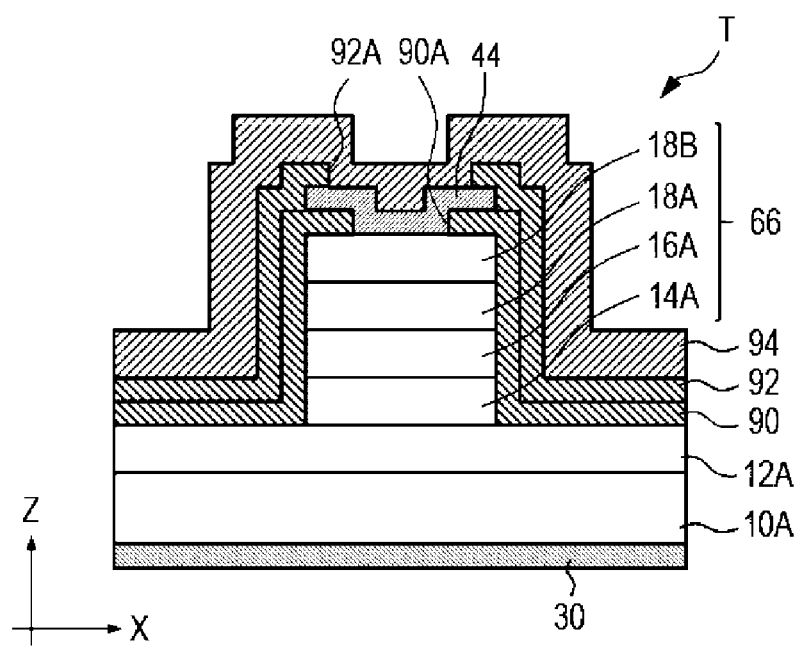
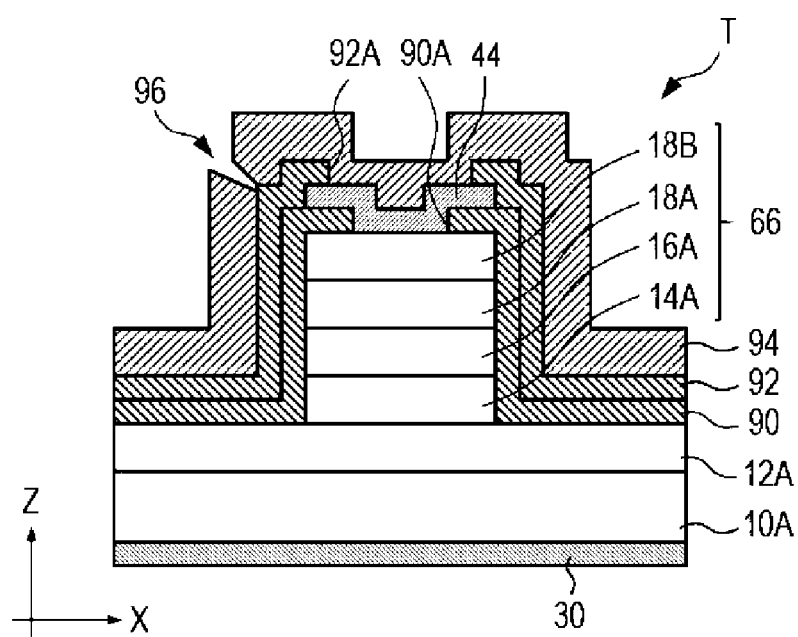

☐ LIGHT BEAM

SEMICONDUCTOR LIGHT EMITTING DEVICE HAVING A SHIFT THYRISTER WITH A LAMINATED STRUCTURE, EXPOSURE HEAD, AND IMAGE FORMING APPARATUS

BACKGROUND OF THE INVENTION

Field of the Invention

The present invention relates to a semiconductor light emitting device, an exposure head, and an image forming apparatus.

Description of the Related Art

As an exposure head for forming a latent image on a photosensitive drum of an image forming apparatus, a surface emitting element array is used. In a typical configuration of this exposure head, a large number of surface emitting elements (light emitting elements configured to emit light perpendicular to the principal surface of a semiconductor substrate) are arranged in a given direction, and a lens array obtained by arranging lenses in the same direction as the arrangement direction of the light emitting elements is provided. Light emitted from the light emitting elements forms an image on the photosensitive drum through the lenses. As the light emitting element, there are known a light emitting element formed of a light emitting diode (LED) and a light emitting element formed of a light emitting thyristor.

In Japanese Patent Application Laid-Open No. 2016-051815, there is disclosed a surface emitting element array using a surface emitting diode or a surface emitting laser (VCSEL) as a light source of such an exposure head. In addition, in Japanese Patent Application Laid-Open No. 2014-216505, there is disclosed a self-scanning light emitting element array using a light emitting thyristor as a light source of such an exposure head.

However, in the related-art self-scanning light emitting element array using the light emitting thyristor, a wire break may occur in a transfer signal line configured to supply a transfer signal for scanning control of the light emitting element array, and a transfer operation may be stopped at some midpoint.

SUMMARY OF THE INVENTION

An object of the present invention is to provide a semiconductor light emitting device, an exposure head, and an image forming apparatus, which include a self-scanning circuit having high reliability.

According to at least one aspect of the present invention, there is provided a semiconductor light emitting device including a plurality of nodes each connected to a gate of a shift thyristor and a gate of a light emitting thyristor, and a plurality of transfer diodes arranged so as to connect the plurality of nodes to each other, wherein the shift thyristor has a laminated structure including a plurality of semiconductor layers, and is provided to a mesa formed separately from the light emitting thyristor and each of the plurality of transfer diodes, wherein the shift thyristor includes a first metal layer continuously provided so as to straddle the mesa, and a second metal layer, which is arranged above the first metal layer, and includes a first part and a second part arranged so as to be opposed to the first part across the mesa, and wherein the first part and the second part of the second metal layer are each electrically connected to the first metal layer in a region that does not overlap the mesa in a plan view.

According to another aspect of the present invention, there is provided a semiconductor device including a mesa having a plurality of semiconductor layers, a first metal layer continuously provided so as to straddle the mesa, and a second metal layer, which is arranged above the first metal layer, and includes a first part and a second part arranged so as to be opposed to the first part across the mesa, wherein the first part and the second part of the second metal layer are each electrically connected to the first metal layer in a region that does not overlap the mesa in a plan view.

Further features of the present invention will become apparent from the following description of exemplary embodiments with reference to the attached drawings.

BRIEF DESCRIPTION OF THE DRAWINGS

FIG. 2A and FIG. 2B are schematic views for illustrating basic structures of elements in the semiconductor light emitting device according to the first embodiment of the present invention.

FIG. 7A and FIG. 7B are schematic cross-sectional views for illustrating a structure of a shift thyristor in the semiconductor light emitting device according to a reference example.

DESCRIPTION OF THE EMBODIMENTS

Preferred embodiments of the present invention will now be described in detail in accordance with the accompanying drawings.

First Embodiment

Figure 1:
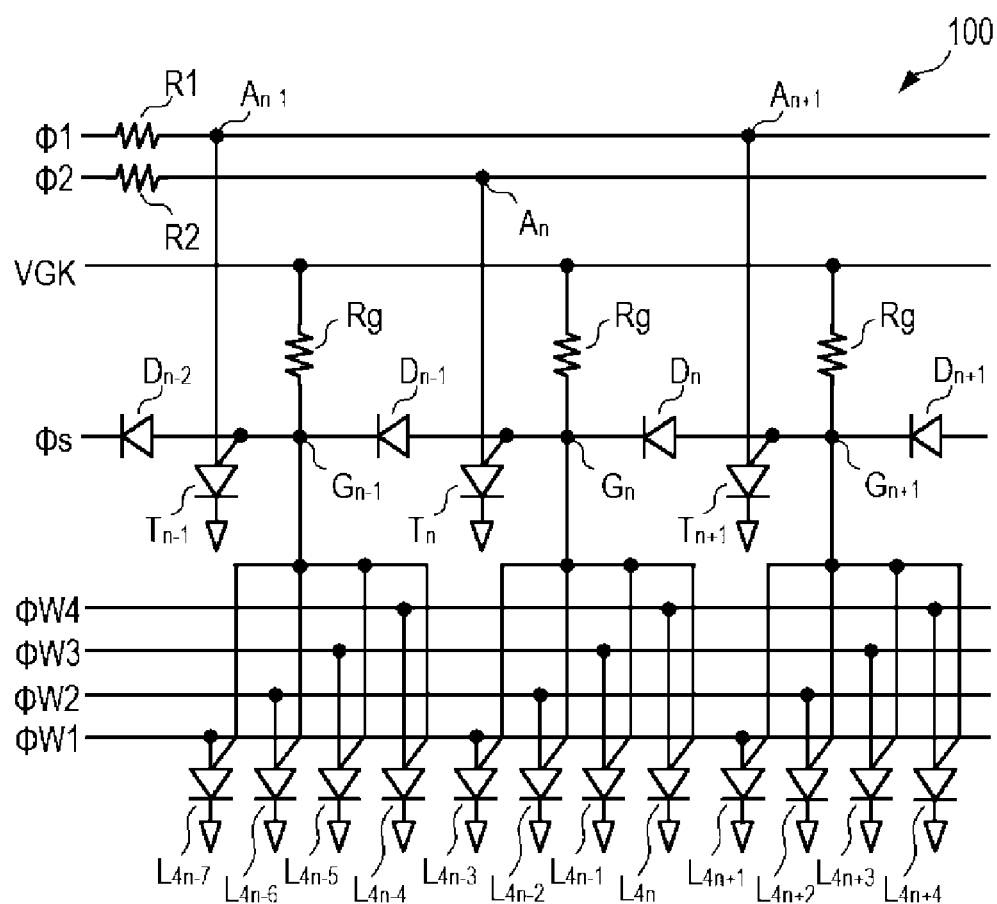
FIG. 1 is an equivalent circuit diagram for illustrating a schematic configuration of a semiconductor light emitting device according to a first embodiment of the present invention.
Figure 3:
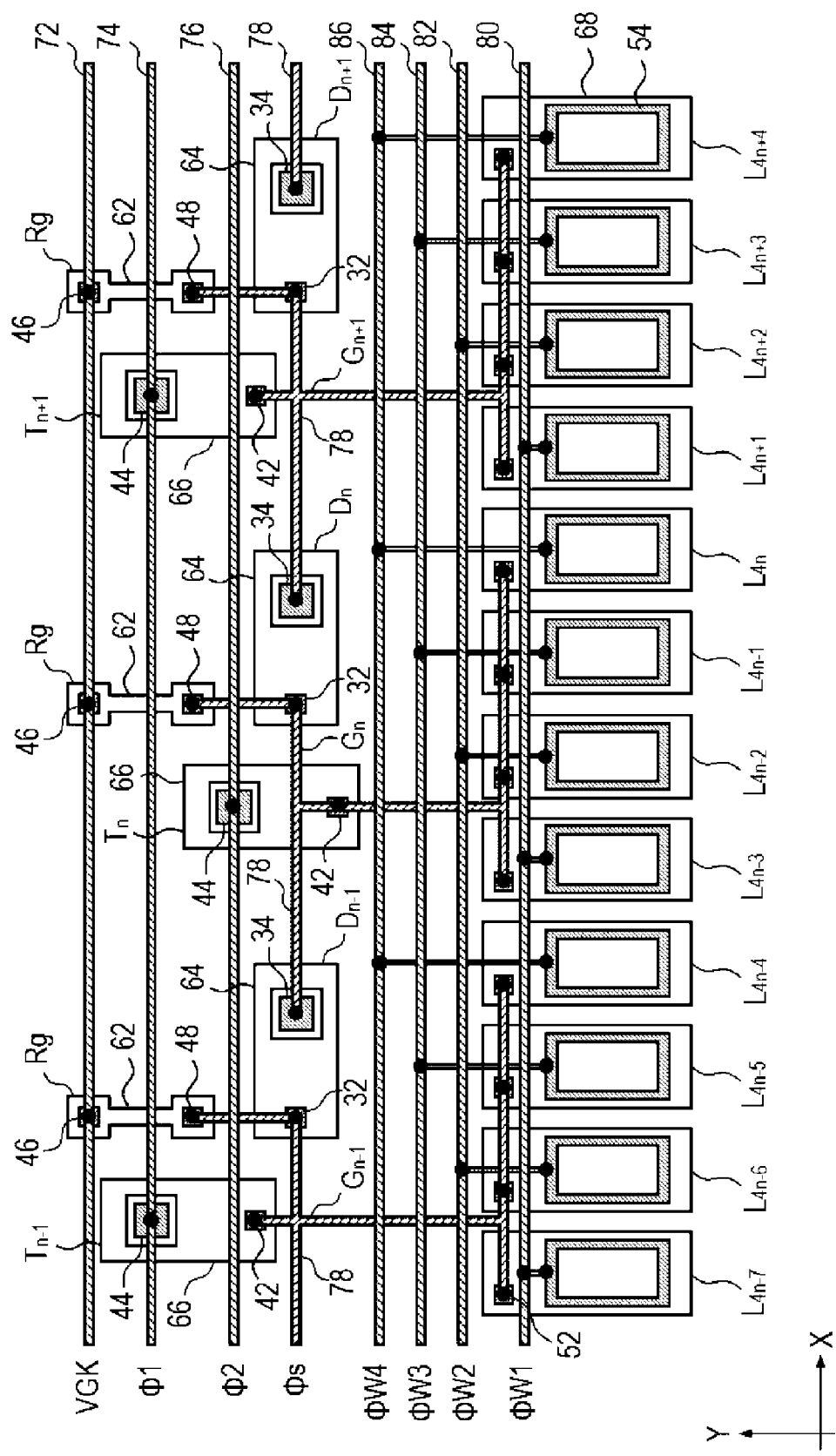
FIG. 3 is a schematic view for illustrating an arrangement example of the elements in the semiconductor light emitting device according to the first embodiment of the present invention.

A schematic configuration of a semiconductor light emitting device according to a first embodiment of the present invention will be described with reference to FIG. 1 to FIG. 3. FIG. 1 is an equivalent circuit diagram for illustrating the schematic configuration of the semiconductor light emitting device according to the present embodiment. FIG. 2A and FIG. 2B are schematic views for illustrating basic structures of elements in the semiconductor light emitting device according to the present embodiment. FIG. 3 is a schematic view for illustrating an arrangement example of the elements in the semiconductor light emitting device according to the present embodiment.

As illustrated in FIG. 1, a semiconductor light emitting device 100 according to the present embodiment includes a plurality of shift thyristors T, a plurality of transfer diodes D, a plurality of light emitting thyristors L, input resistors R1 and R2, and a plurality of gate resistors Rg.

In the semiconductor light emitting device 100 according to the present embodiment, those elements form a self-scanning light emitting device (SLED) using diode coupling. Some self-scanning light emitting devices use a light emitting diode (LED) or a surface emitting laser (VCSEL), but a light emitting device using a thyristor is advantageous in that the number of interconnections is small, and is suitable as an exposure head of, for example, a copying machine. In the self-scanning semiconductor light emitting device, the shift thyristors T are coupled by the transfer diode D to form a potential gradient between gates of the shift thyristors T, and a threshold voltage difference between the shift thyristors T is used to achieve a self-scanning function.

In FIG. 1, in the thus configured self-scanning circuit, three shift thyristors $T_{n-1}$ to $T_{n+1}$ are illustrated as the plurality of shift thyristors T. In addition, twelve light emitting thyristors $L_{4n-7}$ to $L_{4n+4}$ are illustrated as the plurality of light emitting thyristors L. In addition, four transfer diodes $D_{n-2}$ to $D_{n+1}$ are illustrated as the plurality of transfer diodes D. However, the numbers of shift thyristors T, transfer diodes D, and light emitting thyristors L can be appropriately selected depending on, for example, the scale of the light emitting device. The subscript "n" is an integer of 2 or greater.

The transfer diodes $D_{n-2}$ to $D_{n+1}$ are connected in series so that an anode and a cathode of the adjacent transfer diodes D are connected to each other. That is, the anode of the transfer diode $D_{n-2}$ is connected to the cathode of the transfer diode $D_{n-1}$, and the anode of the transfer diode $D_{n-1}$ is connected to the cathode of the transfer diode $D_n$. In addition, the anode of the transfer diode $D_n$ is connected to the cathode of the transfer diode $D_{n+1}$. A series connection body formed of the plurality of transfer diodes $D_{n-2}$ to $D_{n+1}$ forms a start signal line to which a start signal $\Phi$s is to be supplied. The start signal $\Phi$s is to be supplied from a cathode-side end portion of the series connection body.

Each of connection nodes between the adjacent transfer diodes D is connected to a signal line (gate line) to which a power supply voltage VGK is to be supplied through the gate resistor Rg. In addition, the gate of one shift thyristor T and the gates of four light emitting thyristors L are connected to each of the connection nodes between the adjacent transfer diodes D. That is, the gate of the shift thyristor $T_{n-1}$ and the gates of the light emitting thyristors $L_{4n-7}$ to $L_{4n-4}$ are connected to the connection node (common gate $G_{n-1}$) between the transfer diode $D_{n-2}$ and the transfer diode $D_{n-1}$. The gate of the shift thyristor $T_n$ and the gates of the light emitting thyristors $L_{4n-3}$ to $L_{4n}$ are connected to the connection node (common gate $G_n$) between the transfer diode $D_{n-1}$ and the transfer diode $D_n$. The gate of the shift thyristor $T_{n+1}$ and the gates of the light emitting thyristors $L_{4n+1}$ to $L_{4n'4}$ are connected to the connection node (common gate $G_{n+1}$) between the transfer diode $D_n$ and the transfer diode $D_{n+1}$.

The anodes of the odd-numbered shift thyristors T (for example, shift thyristors $T_{n-1}$ and $T_{n+1}$) are connected to a signal line (transfer signal line) to which a transfer signal $\Phi$1 is to be supplied through the input resistor R1. The anodes of the even-numbered shift thyristors T (for example, shift thyristor $T_n$) are connected to a signal line (transfer signal line) to which a transfer signal $\Phi$2 is to be supplied through the input resistor R2.

The anode of the light emitting thyristor L is connected to a predetermined signal line (lighting signal line) to which a lighting signal $\Phi$W is to be supplied. That is, the anodes of the light emitting thyristors $L_{4n-7}$, $L_{4n-3}$, and $L_{4n+1}$ are connected to a lighting signal line to which a lighting signal $\Phi$W1 is to be supplied. The anodes of the light emitting thyristors $L_{4n-6}$, $L_{4n-2}$, and $L_{4n+2}$ are connected to a lighting signal line to which a lighting signal $\Phi$W2 is to be supplied. The anodes of the light emitting thyristors $L_{4n-5}$, $L_{4n-1}$, and $L_{4n+3}$ are connected to a lighting signal line to which a lighting signal $\Phi$W3 is to be supplied. The anodes of the light emitting thyristors $L_{4n-4}$, $L_{4n}$, and $L_{4n+4}$ are connected to a lighting signal line to which a lighting signal $\Phi$W4 is to be supplied.

FIG. 2A and FIG. 2B are schematic views for illustrating basic structures of the gate resistor Rg, the transfer diode D, the shift thyristor T, and the light emitting thyristor L. FIG. 2A is a top view, and FIG. 2B is a cross-sectional view taken along the line A-A' of FIG. 2A.

As illustrated in FIG. 2A and FIG. 2B, the semiconductor light emitting device 100 according to the present embodiment can be formed of a semiconductor layer 12 of a first conductivity type, a semiconductor layer 14 of a second conductivity type, a semiconductor layer 16 of the first conductivity type, and a semiconductor layer 18 of the second conductivity type, which are laminated on a semiconductor substrate 10. The first conductivity type and the second conductivity type are conductivity types different from each other. An exemplary case in which the first conductivity type is n-type and the second conductivity type is p-type is described below. However, the first conductivity type may be p-type and the second conductivity type may be n-type.

A laminated structure including the semiconductor layers 12, 14, 16, and 18 is divided into a region in which the gate resistor Rg is provided, a region in which the transfer diode D is provided, a region in which the shift thyristor T is provided, and a region in which the light emitting thyristor L is provided. That is, the semiconductor layers 14 and 16 in the region (gate resistor portion) in which the gate resistor Rg is provided form a mesa 62. The semiconductor layers 14, 16, and 18 in the region (transfer diode portion) in which the transfer diode D is provided form a mesa 64. The semiconductor layers 14, 16, and 18 in the region (shift thyristor portion) in which the shift thyristor T is provided form a mesa 66. The semiconductor layers 14, 16, and 18 in the region (light emitting thyristor portion) in which the light emitting thyristor L is provided form a mesa 68. The mesas 62, 64, 66, and 68 are provided separately from one another. The mesas 62, 64, 66, and 68 are also provided separately from other mesas 62, 64, 66, and 68 (not shown). The semiconductor layer 12 is provided so as to be continuous over the gate resistor portion, the transfer diode portion, the shift thyristor portion, and the light emitting thyristor portion.

In other words, in the periphery of each of the gate resistor portion (mesa 62), the transfer diode portion (mesa 64), the shift thyristor portion (mesa 66), and the light emitting thyristor portion (mesa 68) in a plan view, the semiconductor layers 14, 16, and 18 have been removed, and the semiconductor layer 12 is exposed. The term "exposed" referred to herein means that none of the semiconductor layers 14, 16, and 18 is provided above its subject, and another member, for example, a passivation film may be provided thereon.

The semiconductor layer 18 in the mesa 62 forming the gate resistor portion has been removed. An electrode 46 and an electrode 48 are provided on the exposed semiconductor layer 16 so as to be spaced apart from each other. The electrodes 46 and 48 are a pair of electrodes of the gate resistor Rg. That is, the semiconductor layer 16 between the electrode 46 and the electrode 48 forms the gate resistor Rg.

The semiconductor layer 18 in the mesa 64 forming the transfer diode portion has been partially removed. An electrode 32 is provided on the semiconductor layer 16 exposed by removing the semiconductor layer 18. An electrode 34 is provided on the semiconductor layer 18. The transfer diode D is formed by a p-n junction between the semiconductor layer 16 and the semiconductor layer 18. The electrode 32 forms a cathode electrode of the transfer diode D, and the electrode 34 forms an anode electrode of the transfer diode D.

The semiconductor layer 18 in the mesa 66 forming the shift thyristor portion has been partially removed. An electrode 42 is provided on the semiconductor layer 16 exposed by removing the semiconductor layer 18. An electrode 44 is provided on the semiconductor layer 18. The shift thyristor T is formed by a p-n-p-n junction among the semiconductor layer 12, the semiconductor layer 14, the semiconductor layer 16, and the semiconductor layer 18. The electrode 44 is an anode electrode of the shift thyristor T, and the electrode 42 is a gate electrode of the shift thyristor T.

The semiconductor layer 18 in the mesa 68 forming the light emitting thyristor portion has been partially removed.

An electrode 52 is provided on the semiconductor layer 16 exposed by removing the semiconductor layer 18. An electrode 54 is provided on the semiconductor layer 18. The light emitting thyristor L is formed by a p-n-p-n junction among the semiconductor layer 12, the semiconductor layer 14, the semiconductor layer 16, and the semiconductor layer 18. The electrode 54 is an anode electrode of the shift thyristor T, and the electrode 52 is a gate electrode of the shift thyristor T.

FIG. 3 is a schematic view for illustrating the arrangement example of the elements forming the self-scanning circuit illustrated in FIG. 1.

A plurality of mesas 62 each forming a gate resistor Rg, a plurality of mesas 64 each forming a transfer diode D, a plurality of mesas 66 each forming a shift thyristor T, and a plurality of mesas 68 each forming a light emitting thyristor L are provided so as to be spaced apart from one another. That is, as described above, the mesas 62, 64, 66, and 68 have the semiconductor layer 12 in common, but have the semiconductor layers 14, 16, and 18 provided separately from one another.

A gate line 72, transfer signal lines 74 and 76, and lighting signal lines 80, 82, 84, and 86 are arranged so as to extend along an X direction in a coordinate system illustrated in FIG. 3.

The gate line 72 is connected to the electrode 46 provided to each of the mesas 62. The transfer signal line 74 is connected to the electrode 44 provided to each of the odd-numbered mesas 66. The transfer signal line 76 is connected to the electrode 44 provided to each of the even-numbered mesas 66. Each of interconnections 78 forming a common gate G is connected to the electrode 48 provided to the mesa 62, the electrode 32 and the electrode 34 provided to the adjacent mesas 64, the electrode 42 provided to the mesa 66, and the electrode 52 provided to the mesa 68. With this configuration, the start signal line is formed by the plurality of transfer diodes $D_{n-2}$ to $D_{n+1}$ connected in series through the interconnections 78 forming the common gate G. Each of signal lines forming the lighting signal lines 80, 82, 84, and 86 is connected to the electrodes 54 provided to the mesa 68 corresponding to the each of the signal lines.

In the semiconductor light emitting device 100 according to the present embodiment, as illustrated in FIG. 3, the transfer signal lines 74 and 76 and the electrodes 44 of the mesas 66 are arranged so as to overlap each other in a plan view. The transfer signal lines 74 and 76 are each provided so as to extend over the mesa 66 in a portion overlapping with the mesa 66.

Next, a transfer operation of the shift thyristor T in an on state in the semiconductor light emitting device according to the present embodiment is described with reference to FIG. 1 and FIG. 4A to FIG. 4C. In this case, it is assumed that the power supply voltage VGK supplied to the gate line 72 is 5 V, and that voltages of the transfer signals Φ1 and Φ2 supplied to the transfer signal lines 74 and 76, respectively, and the lighting signals ΦW1 to ΦW4 supplied to the lighting signal lines 80, 82, 84, and 86, respectively, are each 0 V or 5 V.

Figure 4A:
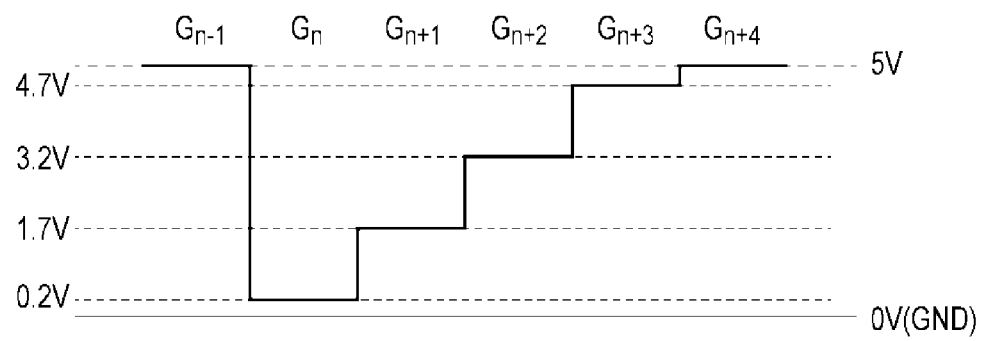
FIG. 4A, FIG. 4B, and FIG. 4C are diagrams for illustrating a transfer operation of a shift thyristor in an on state in the semiconductor light emitting device according to the first embodiment of the present invention.
Figure 4B:
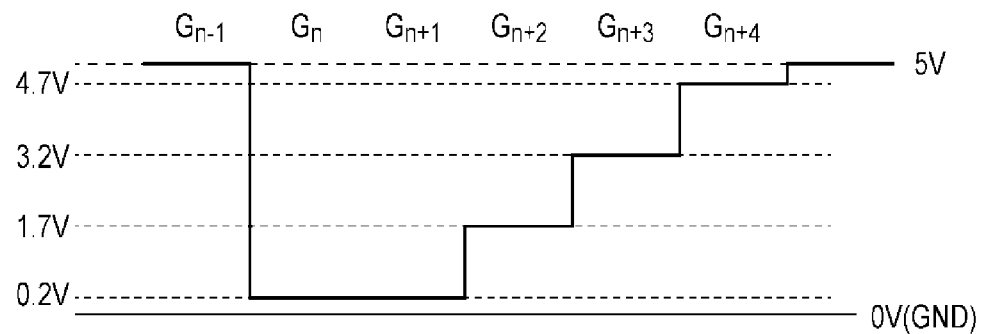
Figure 4C:
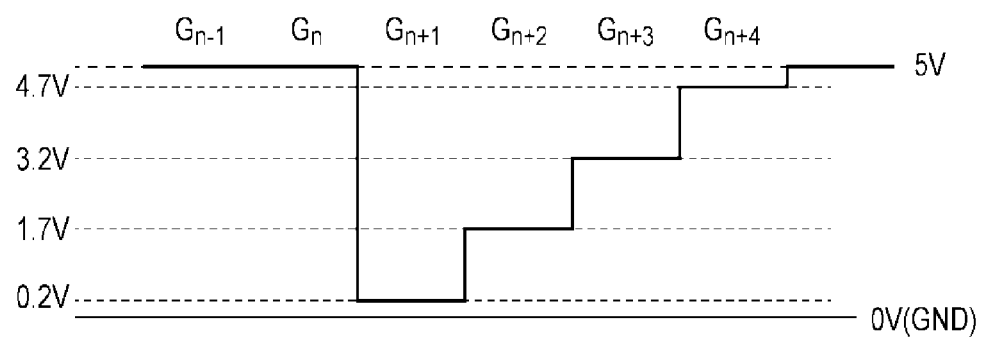

FIG. 4A to FIG. 4C are diagrams for illustrating the transfer operation of a shift thyristor in an on state in the semiconductor light emitting device according to the present embodiment.

In FIG. 4A, a potential distribution of the common gates $G_{n-1}$ to $G_{n+4}$, which is exhibited when the transfer signal Φ1 is 0 V, the transfer signal Φ2 is 5 V, and the shift thyristor $T_n$ is in an on state, is illustrated. The common gates $G_{n+2}$, $G_{n+3}$, and $G_{n+4}$ are common gates (not shown in FIG. 1) succeeding the common gate $G_{n+1}$. The shift thyristors T connected to the common gates $G_{n+2}$ and $G_{n+3}$ are shift thyristors $T_{n+2}$ and $T_{n+3}$, respectively.

When the shift thyristor $T_n$ is in an on state, the potential of the common gate $G_n$ connected to the gate of the shift thyristor $T_n$ and the gates of the light emitting thyristors $L_{4n-3}$ to $L_{4n}$ is lowered to about 0.2 V. A potential difference substantially equal to a diffusion potential of the transfer diode $D_n$ connecting the common gate $G_n$ and the common gate $G_{n+1}$ occurs between the common gate $G_n$ and the common gate $G_{n+1}$. In the present embodiment, the diffusion potential of the transfer diode $D_n$ is about 1.5 V, and the potential of the common gate $G_{n+1}$ becomes 1.7 V, which is obtained by adding 1.5 V being the diffusion potential of the transfer diode $D_n$ to 0.2 V being the potential of the common gate $G_n$. In the same manner, the potential of the common gate $G_{n+2}$ (not shown) becomes 3.2 V, and the potential of the common gate $G_{n+3}$ (not shown) becomes 4.7 V.

In this case, an upper limit voltage of the common gate G is the power supply voltage VGK, and hence the potentials of the common gate $G_{n+4}$ and the subsequent common gates each become 5 V being the value of the power supply voltage VGK. Further, the transfer diode D between the common gate $G_n$ and the common gate $G_{n-1}$ is reversely biased, and hence the power supply voltage VGK is directly supplied to the common gate $G_{n-1}$. The same applies to the common gates G preceding the common gate $G_{n-1}$. That is, the potential of, for example, the common gate $G_{n-1}$ preceding the common gate $G_n$ becomes 5 V being the value of the power supply voltage VGK. Thus, such a potential gradient as illustrated in FIG. 4A is formed on the common gates $G_n$ to $G_{n+3}$.

A voltage (threshold voltage) required for the shift thyristor T to be turned on is substantially the same as a voltage obtained by adding the diffusion potential to a gate potential. When the shift thyristor $T_n$ is in an on state, the shift thyristor $T_{n+2}$ has the lowest gate potential among the other shift thyristors T connected to a transfer signal line to which the transfer signal Φ2 is supplied. The potential of the common gate $G_{n+2}$ corresponding to the shift thyristor $T_{n+2}$ is 3.2 V as described above, and the threshold voltage of the shift thyristor $T_{n+2}$ becomes 4.7 V.

However, the shift thyristor $T_n$ is in an on state, and hence the potential of the transfer signal line to which the transfer signal Φ2 is supplied has been lowered to the voltage (about 1.5 V) corresponding to the diffusion potential. Therefore, the potential of the transfer signal line to which the transfer signal Φ2 is supplied is lower than the threshold voltage of the shift thyristor $T_{n+2}$, to thereby inhibit the shift thyristor $T_{n+2}$ to be turned on. All the other shift thyristors T connected to the same transfer signal line have threshold voltages higher than the shift thyristor $T_{n+2}$, to thereby be inhibited from being turned on in the same manner as in the case of the shift thyristor $T_{n+2}$. As a result, only the shift thyristor $T_n$ can maintain its on state.

In FIG. 4B, a potential distribution of the common gates $G_{n-1}$ to $G_{n+4}$, which is exhibited when the transfer signal Φ1 is shifted to 5 V from the state of FIG. 4A, is illustrated.

With attention being given to the shift thyristor T connected to the transfer signal line to which the transfer signal Φ1 is supplied, the threshold voltage of the shift thyristor $T_{n+1}$ having the lowest threshold voltage is 3.2 V. The threshold voltage of the shift thyristor $T_{n+3}$ having the second lowest threshold voltage is 6.2 V. Therefore, when the transfer signal Φ1 is shifted from 0 V to 5 V under the above-mentioned state, only the shift thyristor $T_{n+1}$ among the shift thyristors T connected to the transfer signal line to which the transfer signal Φ1 is supplied can be brought to an on state. Under this state, the shift thyristor $T_n$ and the shift thyristor $T_{n+1}$ have been turned on, and the gate potentials of the shift thyristors T on the right side of the shift thyristor $T_{n+1}$ each decrease by the diffusion potential. However, the power supply voltage VGK is 5 V, and the gate potential is restricted by the power supply voltage VGK. Therefore, the gate potentials of the shift thyristors T on the right side of a shift thyristor $T_{n+5}$ (not shown) become 5 V.

In FIG. 4C, a potential distribution of the common gates $G_{n-1}$ to $G_{n+4}$, which is exhibited when the transfer signal Φ2 is shifted to 0 V from the state of FIG. 4B, is illustrated.

When the transfer signal Φ2 is shifted from 5 V to 0 V, the shift thyristor $T_n$ is turned off. Thus, the potential of the common gate $G_n$ rises to the power supply voltage VGK.

In this manner, the transfer of an on state from the shift thyristor $T_n$ to the shift thyristor $T_{n+1}$ is completed.

Next, a light emitting operation of the light emitting thyristor L in the semiconductor light emitting device according to the present embodiment is described with reference to FIG. 1, FIG. 4A to FIG. 4C, and FIG. 5. In this case, it is assumed that the power supply voltage VGK supplied to the gate line is 5 V, and the voltages of the transfer signals Φ1 and Φ2 supplied to the transfer signal line and the lighting signals ΦW1, ΦW2, ΦW3, and ΦW4 supplied to the lighting signal line are each 0 V or 5 V.

When the shift thyristor $T_n$ is in an on state, the potential of the common gate $G_n$ is about 0.2 V as described above. Therefore, the threshold voltages of the light emitting thyristors $L_{4n-3}$ to $L_{4n}$ connected to the common gate $G_n$ are each 1.7 V. That is, when the lighting signals ΦW1 to ΦW4 having a voltage equal to or higher 1.7 V are supplied, the light emitting thyristors $L_{4n-3}$ to $L_{4n}$ can be lit. In this case, the lighting signals ΦW1, ΦW2, ΦW3, and ΦW4 correspond to the light emitting thyristors $L_{4n-3}$, $L_{4n-2}$, $L_{4n-1}$, and $L_{4n}$, respectively. Therefore, the light emitting thyristors $L_{4n-3}$, $L_{4n-2}$, $L_{4n-1}$, and $L_{4n}$ can be lit with a suitable combination depending on a combination the lighting signals ΦW1, ΦW2, ΦW3, and ΦW4.

When the potential of the common gate $G_n$ is 0.2 V, the potential of the adjacent common gate $G_{n+1}$ is 1.7 V, and the threshold voltages of the light emitting thyristors $L_{4n+1}$ to $L_{4n+4}$ connected to the common gate $G_{n+1}$ are each 3.2 V. The lighting signals ΦW1 to ΦW4 are each 5 V, and hence it appears that the light emitting thyristors $L_{4n+1}$ to $L_{4n+4}$ are lit simultaneously with the lighting drive of the light emitting thyristors $L_{4n-3}$ to $L_{4n}$.

However, the threshold voltages of the light emitting thyristors $L_{4n-3}$ to $L_{4n}$ are lower than the threshold voltages of the light emitting thyristors $L_{4n+1}$ to $L_{4n+4}$, and hence the light emitting thyristors $L_{4n-3}$ to $L_{4n}$ are turned on earlier than the light emitting thyristors $L_{4n+1}$ to $L_{4n+4}$. Once the light emitting thyristors $L_{4n+1}$ to $L_{4n+4}$ are turned on, the potential of the lighting signal line connected to the light emitting thyristors $L_{4n+1}$ to $L_{4n+4}$ that have been turned on is lowered to 1.5 V corresponding to the diffusion potential. As a result, the potential of the lighting signal line becomes lower than the threshold voltages of the light emitting thyristors $L_{4n+1}$ to $L_{4n+4}$, to thereby inhibit the light emitting thyristors $L_{4n+1}$ to $L_{4n+4}$ from being turned on.

Figure 5:
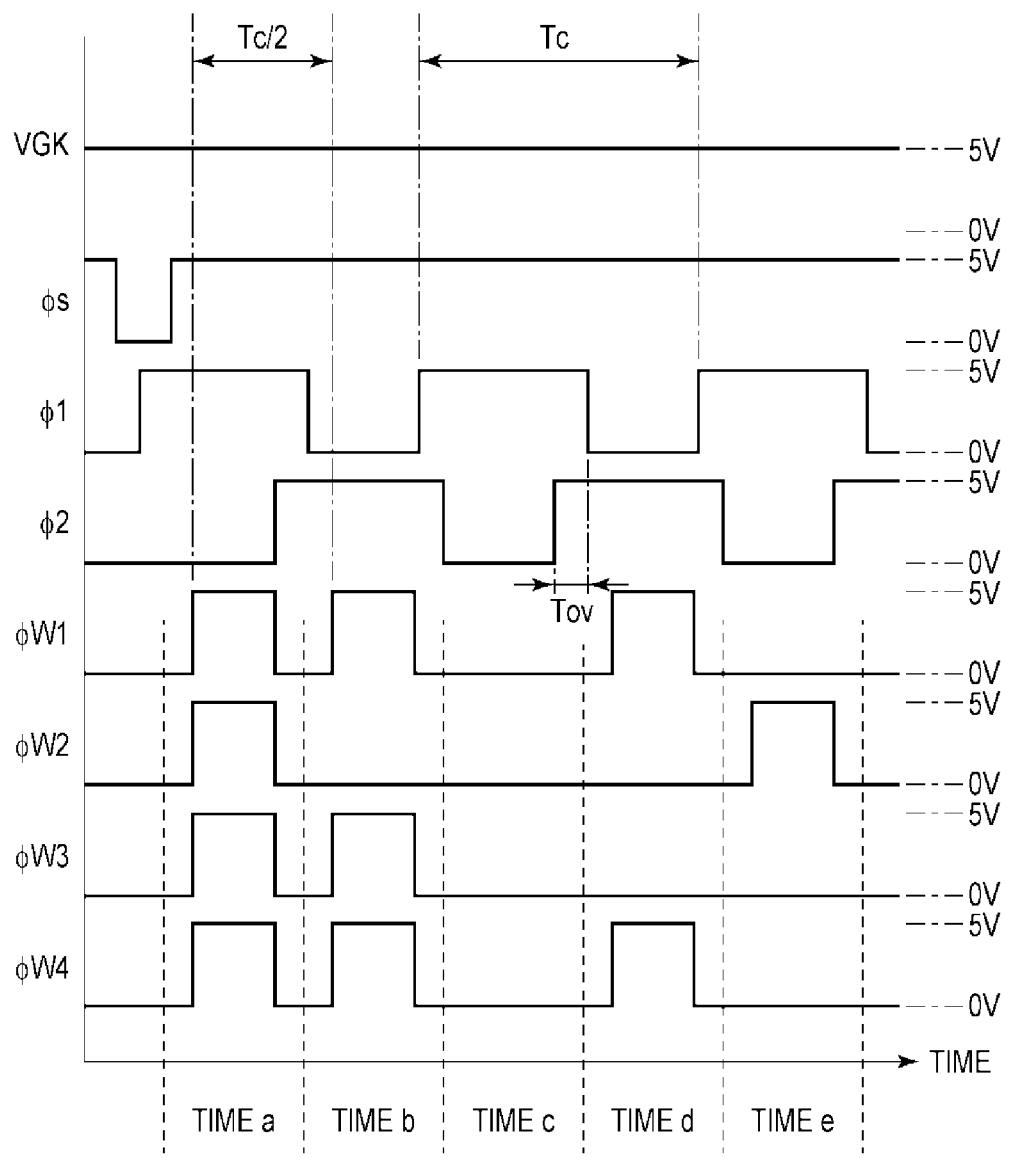
FIG. 5 is a timing chart for showing a method of driving the semiconductor light emitting device according to the first embodiment of the present invention.

FIG. 5 is a timing chart for showing a method of driving the semiconductor light emitting device according to the present embodiment. In FIG. 5, the power supply voltage VGK, the start signal Φs, the transfer signals Φ1 and Φ2, and the lighting signals ΦW1, ΦW2, ΦW3, and ΦW4 are illustrated. The transfer signal Φ1 is a clock signal for the odd-numbered shift thyristors T, and the transfer signal Φ2 is a clock signal for the even-numbered shift thyristors T.

First, the start signal Φs is shifted from 5 V to 0 V. Thus, the potential of the common gate G (for example, common gate $G_{n-1}$) connected to the gate of the shift thyristor T closest to the input side of the start signal Φs is lowered from 5 V to 1.7 V, and the threshold voltage of the shift thyristor $T_{n-1}$ becomes 3.2 V. This enables the shift thyristor $T_{n-1}$ to be turned on by the transfer signal Φ1.

Subsequently, the transfer signal Φ1 is shifted from 0 V to 5 V to turn on the shift thyristor $T_{n-1}$. Then, the start signal θs is shifted for 0 V to 5 V with a slight delay after the shift thyristor $T_{n-1}$ is turned on. The start signal Φs is maintained at 5 V until the next timing of starting the lighting operation.

The transfer signal Φ1 is the clock signal for the odd-numbered shift thyristors T, and is a periodic pulse that rises from 0 V to 5 V at a cycle period Tc. The transfer signal Φ2 is the clock signal for the even-numbered shift thyristors T, and is a periodic pulse that rises from 0 V to 5 V at the same cycle period Tc as that of the transfer signal Φ1. The transfer signal Φ1 and the transfer signal Φ2 are signals having substantially reverse phases, but are configured to have a period Tov in which the on states (periods of 5 V) of the preceding pulse and the succeeding pulse overlap each other.

The lighting signals ΦW1, ΦW2, ΦW3, and ΦW4 are transmitted at a half cycle period (Tc/2) of that of the transfer signals Φ1 and Φ2. When the lighting signal ΦW of 5 V is applied while the shift thyristor T is in an on state, the light emitting thyristor L corresponding to the lighting signal ΦW that has become 5 V is lit.

For example, at a time "a", of the four light emitting thyristors L connected to the same shift thyristor T (for example, shift thyristor $T_{n-1}$), all the four light emitting thyristors L corresponding to the lighting signals ΦW1, ΦW2, ΦW3, and ΦW4 are lit simultaneously. At a time "b", of the four light emitting thyristors L connected to the same shift thyristor T (for example, shift thyristor $T_n$), three light emitting thyristors L corresponding to the lighting signals ΦW1, ΦW3, and ΦW4 are lit simultaneously. At a time "c", all the lighting signals ΦW1, ΦW2, ΦW3, and ΦW4 are 0 V, and all the light emitting thyristors L are in an unlit state. At a time "d", of the four light emitting thyristors L connected to the same shift thyristor T (for example, shift thyristor $T_{n+2}$), two light emitting thyristors L corresponding to the lighting signals ΦW1 and ΦW4 are lit simultaneously. At a time "e", of the four light emitting thyristors L connected to the same shift thyristor T (for example, shift thyristor $T_{n+3}$ (not shown)), only the light emitting thyristor L corresponding to the lighting signal ΦW2 is lit.

Figure 6A:
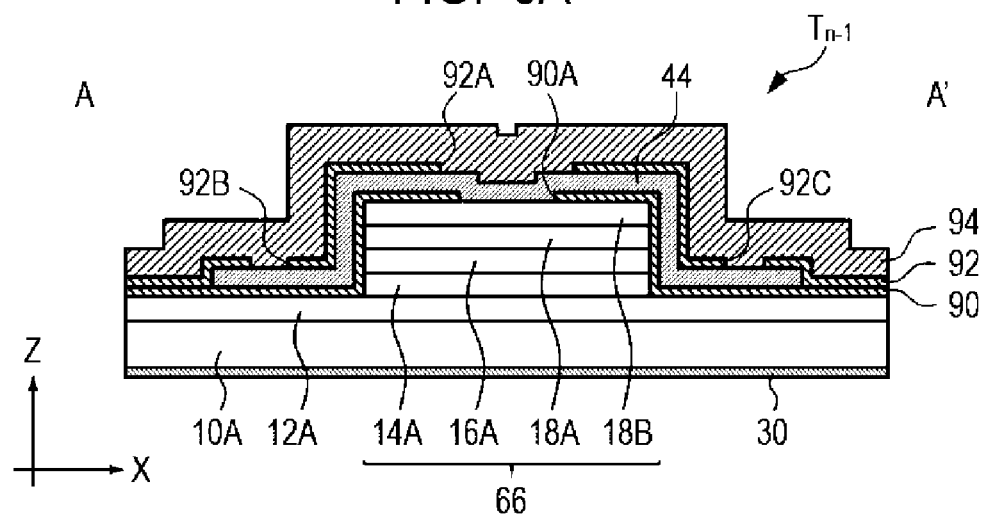
FIG. 6A and FIG. 6B are schematic cross-sectional views for illustrating a structure of the shift thyristor in the semiconductor light emitting device according to the first embodiment of the present invention.
Figure 6B:
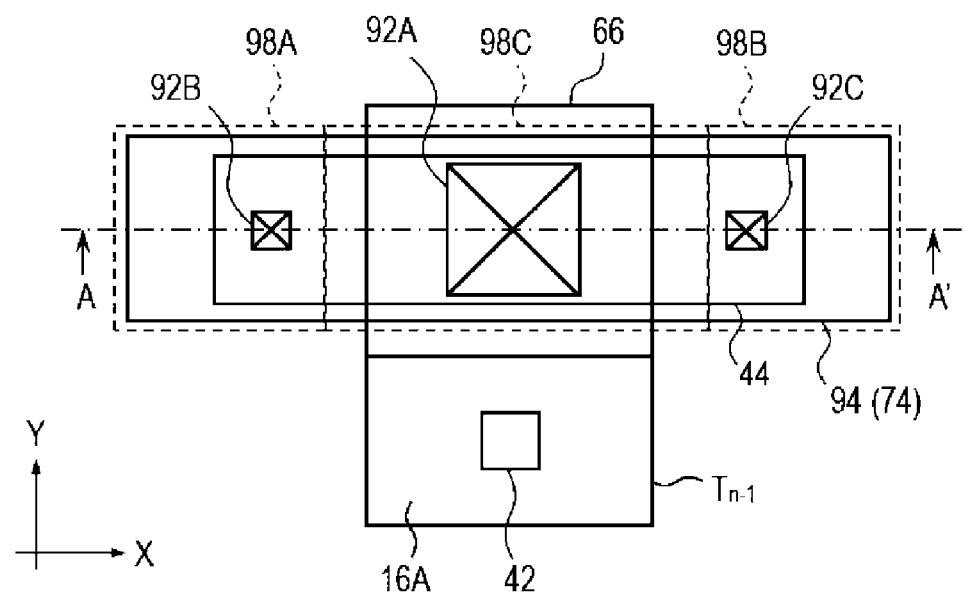

Next, a specific configuration example of the shift thyristor T in the semiconductor light emitting device according to the present embodiment is described by taking the shift thyristor $T_{n-1}$ illustrated in FIG. 3 as an example with reference to FIG. 6A and FIG. 6B. FIG. 6A is a schematic cross-sectional view of the shift thyristor T when viewed along an extending direction (X direction in FIG. 3) of the transfer signal line 74. FIG. 6B is a view for illustrating an example of a planar layout of the shift thyristor T, and FIG. 6A corresponds to a cross-sectional view taken along the line A-A' of FIG. 6B. In FIG. 6A and FIG. 6B, components corresponding to the components described with reference to FIG. 2A and FIG. 2B are denoted by the same reference symbols to which the suffixes A and B are added. The transfer signal line 74 is described below, but the same applies to the transfer signal line 76.

On an n-type GaAs substrate 10A, an n-type AlGaAs layer 12A, a p-type AlGaAs layer 14A, an n-type AlGaAs layer 16A, a p-type AlGaAs layer 18A, and a p-type AlGaAs layer 18B are provided. The shift thyristor T is formed by a p-n-p-n junction of the p-type AlGaAs layer 18A, the n-type AlGaAs layer 16A, the p-type AlGaAs layer 14A, and the n-type AlGaAs layer 12A. The p-type AlGaAs layer 18B is a contact layer between the AlGaAs layer 18A and the electrode 44 arranged thereon.

The AlGaAs layer 14A, the AlGaAs layer 16A, the AlGaAs layer 18A, and the AlGaAs layer 18B on the AlGaAs layer 12A are partially removed. Thus, the mesa 66 having a laminated structure of the AlGaAs layer 14A, the AlGaAs layer 16A, the AlGaAs layer 18A, and the AlGaAs layer 18B is formed.

An insulating film 90 having an opening portion 90A in which the AlGaAs layer 18B is partially exposed is provided on an upper surface of the AlGaAs layer 12A exposed by removing the AlGaAs layers 14A, 16A, 18A, and 18B, a side surface of the mesa 66, and an upper surface of the AlGaAs layer 18B. The electrode 44, which extends from both sides of the mesa 66 along the extending direction (X direction) of the transfer signal line 74 to the side surface and the upper surface of the mesa 66 to be connected to the AlGaAs layer 18B through the opening portion 90A, is provided on the insulating film 90. The electrode 44 is continuously provided so as to straddle the mesa 66. The electrode 44 can be formed of a metal layer containing, for example, Au.

An insulating film 92 having opening portions 92A, 92B, and 92C for exposing the electrode 44 is provided on the insulating film 90 provided with the electrode 44. The opening portion 92A exposes the electrode 44 in a portion in which the electrode 44 is located above the mesa 66. The opening portions 92B and 92C expose the electrode 44 in portions in which the electrode 44 is located above the AlGaAs layer 12A on both sides of the mesa 66.

An interconnection 94 forming the transfer signal line 74 is provided on the insulating film 92. As illustrated in FIG. 3, the transfer signal line 74 is provided so as to extend in the X direction, and intersects the shift thyristor portion (mesa 66). The interconnection 94 (transfer signal line 74) is provided so as to straddle the mesa 66 through portions in which the opening portions 92A, 92B, and 92C are formed, and is connected to the electrode 44 through the opening portions 92A, 92B, and 92C. The interconnection 94 is arranged above the electrode 44, and can be formed of a metal layer containing, for example, Au.

As illustrated in FIG. 6B, the interconnection 94 includes a first part 98A, a second part 98B arranged so as to be opposed to the first part 98A across the mesa 66, and a third part 98C, which is arranged so as to straddle the mesa 66 and extends continuously from the first part 98A and the second part 98B. The first part 98A and the second part 98B of the interconnection 94 are each electrically connected to the electrode 44 in regions that do not overlap the mesa 66 in a plan view. That is, the first part 98A is electrically connected to the electrode 44 through the opening portion 92B formed in the region that does not overlap the mesa 66 in a plan view. Meanwhile, the second part 98B is electrically connected to the electrode 44 through the opening portion 92C formed in the region that does not overlap the mesa 66 in a plan view. In addition, in the present embodiment, the third part 98C of the interconnection 94 is electrically connected to the electrode 44 through the opening portion 92A formed in a region that overlaps the mesa 66 in a plan view.

In this manner, in the semiconductor light emitting device according to the present embodiment, the interconnection 94 (transfer signal line 74) is electrically connected to the electrode 44 at three locations through the three opening portions 92B, 92A, and 92C arranged along the extending direction of the interconnection 94, that is, a transfer direction of the transfer signal.

Figure 8A:
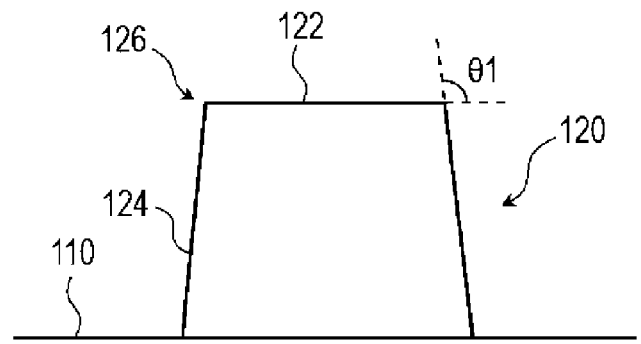
FIG. 8A, FIG. 8B, and FIG. 8C are diagrams for illustrating a mechanism in which a crack occurs in a transfer signal line.
Figure 8B:
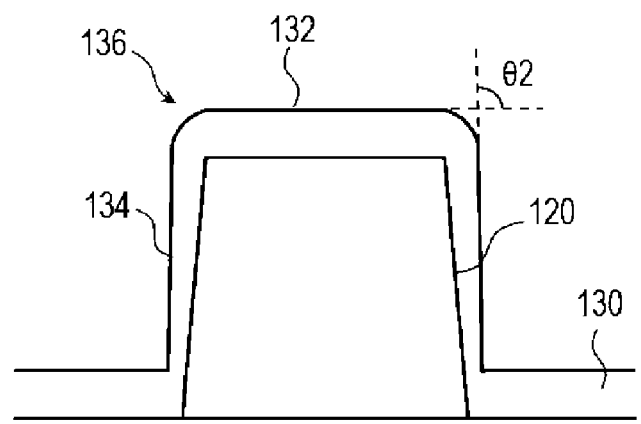
Figure 8C:
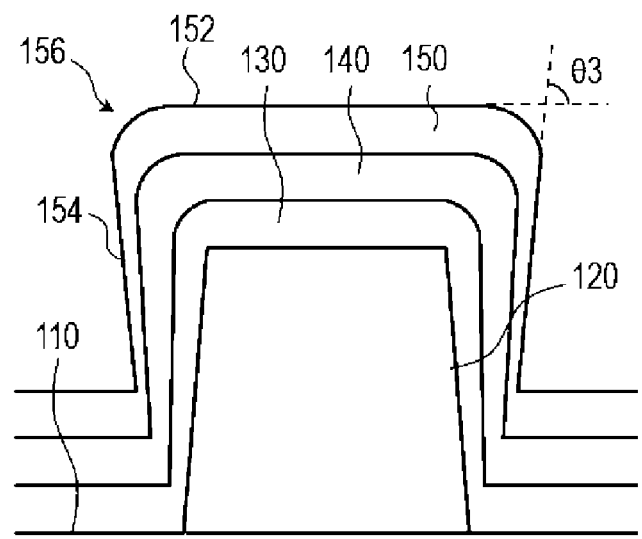

A reason for forming an electrically connecting portion between the electrode 44 and the transfer signal line 74 in the above-mentioned manner in the present embodiment is described by taking a semiconductor light emitting device according to a reference example as an example with reference to FIG. 7A to FIG. 8C. FIG. 7A and FIG. 7B are schematic cross-sectional views for illustrating a structure of a shift thyristor portion in the semiconductor light emitting device according to the reference example. FIG. 8A to FIG. 8C are diagrams for illustrating a mechanism in which a crack occurs in the interconnection. The same components as those of the semiconductor light emitting device according to the present embodiment are denoted by the same reference symbols, and the description thereof is omitted.

In the semiconductor light emitting device according to the reference example, as illustrated in FIG. 7A, the electrode 44 and the interconnection 94 (transfer signal line 74) are connected to each other through the opening portion 92A formed in the upper surface of the mesa 66. However, as a result of extensive investigation performed on this structure by the inventor of the subject application, it has turned out that a crack 96 occurs in the interconnection 94 in the portion in which the transfer signal line 74 straddles the mesa 66, and in the worst case, a wire break occurs in the transfer signal line 74, as illustrated in FIG. 7B. It is considered that the crack 96 that occurs in the interconnection 94 is caused by a large structural difference in level in the portion in which the mesa 66 is provided. When a wire break occurs in the transfer signal lines 74 and 76, the transfer signal is no longer supplied through the transfer signal lines 74 and 76, and the transfer operation for the on state of the shift thyristor T described with reference to FIG. 4A to FIG. 4C is stopped at some midpoint.

One of the factors causing the crack 96 to occur in the interconnection 94 is deterioration of a mesa shape due to repeated film formation after the formation of the mesa 66. The deterioration of the mesa shape is described with reference to FIG. 8A to FIG. 8C.

As illustrated in FIG. 8A, it is assumed that a mesa 120 is provided on an underlying portion 110. The mesa 120 has an upper surface 122, a side surface 124, and a corner portion 126 between the upper surface 122 and the side surface 124. In relation to the semiconductor light emitting device according to the reference example, the underlying portion 110 corresponds to, for example, the AlGaAs layer 12A, and the mesa 120 corresponds to, for example, the mesa 66. It is assumed that an angle (mesa angle) formed by the upper surface 122 and the side surface 124 at the corner portion 126 immediately after the formation of the mesa 120 is defined as an angle $\theta 1$ as illustrated in FIG. 8A.

As illustrated in FIG. 8B, it is assumed that a film 130 including an insulating film or a metal film is formed on the mesa 120. In general, a film forming material flies from a direction that is nearly parallel to the normal direction of the underlying portion 110, and hence a film is formed to be thicker on the upper surface 122 of the mesa 120 and on the underlying portion 110 than on the side surface of the mesa 120. As a result, assuming that the angle (mesa angle) formed at the corner portion 136 by a surface 132 of the film 130 on the upper surface 122 side and a surface 134 of the film 130 on the side surface 124 side is an angle $\theta 2$, the angle $\theta 2$ becomes more acute than the angle $\theta 1$.

A tendency that a film is formed to be thicker on the upper surface 122 side than on the side surface 124 side of the mesa 120 becomes more remarkable as the mesa angle becomes more acute. For example, when a film 140 and a film 150 are further formed on the film 130, assuming that, as illustrated in FIG. 8C, an angle (mesa angle) formed by a surface 152 of the film 150 on the upper surface 122 side and a surface 154 of the film 150 on the side surface 124 side at the corner portion 156 is $\theta 3$, the angle $\theta 3$ becomes more acute than the angle $\theta 2$.

In this manner, as the mesa angle becomes more acute in accordance with the film formation, the film formed on the side surface 124 side of the mesa 120 becomes thinner, and a crack is more liable to occur. In the semiconductor light emitting device according to the reference example, a process of forming a metal film as the interconnection 94 is performed last, so a crack is particularly liable to occur. In addition, more cracks tend to occur as the thickness of the interconnection 94 increases. This is considered to be influenced by the stress of the interconnection 94.

Figure 9:
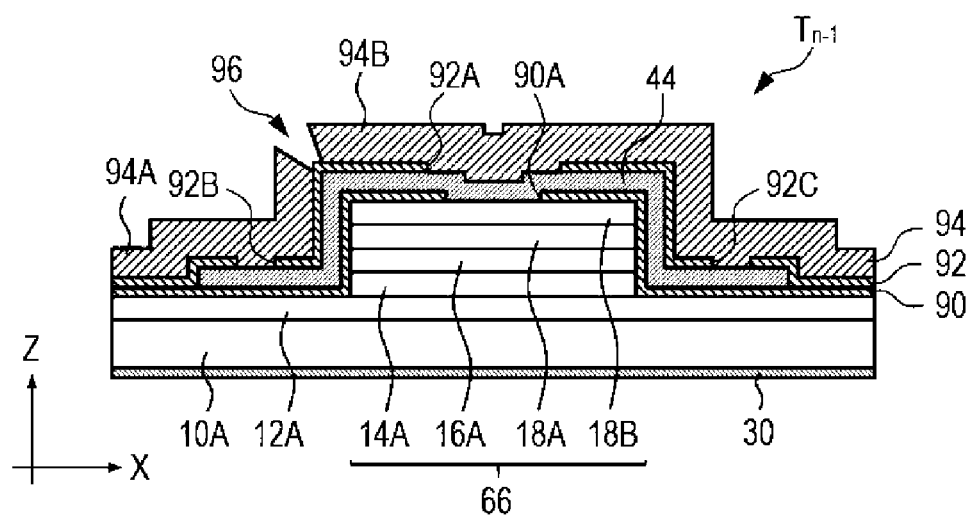
FIG. 9 is a view for illustrating an effect of the shift thyristor in the semiconductor light emitting device according to the first embodiment of the present invention.

Even in the semiconductor light emitting device according to the present embodiment, there is a possibility in that, as illustrated in, for example, FIG. 9, the crack 96 may occur in the interconnection 94 forming the transfer signal line 74 due to the same mechanism as that of the semiconductor light emitting device according to the reference example.

However, in the semiconductor light emitting device according to the present embodiment, the electrode 44 and the interconnection 94 are electrically connected to each other through the opening portions 92B and 92C provided on both sides of the mesa 66 and the opening portion 92A provided on the mesa 66. Therefore, even when the crack 96 occurs in the interconnection 94 to divide the interconnection 94 into the interconnection 94A and the interconnection 94B, electrical connection between the interconnection 94A and the interconnection 94B can be maintained by the electrode 44.

The electrode 44 is formed immediately after the insulating film 90 is formed, and hence the mesa shape deteriorates less during film formation, to thereby cause a crack to be less liable to occur in the electrode 44 than in the interconnection 94. In addition, the thickness of the electrode 44 is smaller than the thickness of the interconnection 94, and hence a crack is less liable to occur in the electrode 44 than in the interconnection 94. In addition, the insulating film 92 is provided between the electrode 44 and the interconnection 94 at the corner portion of the mesa 66, and hence even when the interconnection 94 is thickened, the stress of the interconnection 94 does not easily exert an influence on the electrode 44.

Therefore, with the semiconductor light emitting device according to the present embodiment, it is possible to reduce the influence exerted when a crack occurs in the interconnection 94 forming each of the transfer signal lines 74 and 76, and to prevent the transfer operation from being stopped at some midpoint. Thus, a semiconductor light emitting device including a highly reliable self-scanning circuit can be achieved.

Next, a method of manufacturing the semiconductor light emitting device according to the present embodiment is described with reference to FIG. 10A to FIG. 10E. FIG. 10A to FIG. 10E are process cross-sectional views for illustrating the method of manufacturing the semiconductor light emitting device according to the present embodiment.

First, AlGaAs layers 12A, 14A, 16A, 18A, and 18B are epitaxially grown on the n-type GaAs substrate 10A through use of, for example, a molecular beam epitaxy (MBE) method.

In this case, the composition, thickness, and impurity concentration of each of the AlGaAs layers 12A, 14A, 16A, and 18A are appropriately set so that desired thyristor characteristics can be obtained in the light emitting thyristor L and the shift thyristor T. In addition, the AlGaAs layers 16A and 18A are appropriately set so that desired diode characteristics can be obtained as the transfer diode D.

For example, the AlGaAs layer 12A can be formed of an n-type AlGaAs layer having a thickness of 600 nm, an Al composition of 25%, and a donor impurity concentration of $2\times10^{18}$ cm$^{-3}$. The AlGaAs layer 14A can be formed of a p-type AlGaAs layer having a thickness of 700 nm, an Al composition of 25%, and an acceptor impurity concentration of $2\times10^{18}$ cm$^{-3}$. The AlGaAs layer 16A can be formed of an n-type AlGaAs layer having a thickness of 350 nm, an Al composition of 15%, and a donor impurity concentration of $2\times10^{17}$ cm$^{-3}$. The AlGaAs layer 18A can be formed of a p-type AlGaAs layer having a thickness of 320 nm, an Al composition of 30%, and an acceptor impurity concentration of $2\times10^{17}$ cm$^{-3}$.

It is difficult for the AlGaAs layer 18A having a low impurity concentration to form an ohmic contact with a metal electrode (electrode 44), and hence the AlGaAs layer 18B is provided as a contact layer. The AlGaAs layer 18B can be formed of a p-type AlGaAs layer having a thickness of 200 nm, an Al composition of 30%, and an acceptor impurity concentration of $7\times10^{19}$ cm$^{-3}$.

Figure 10A:
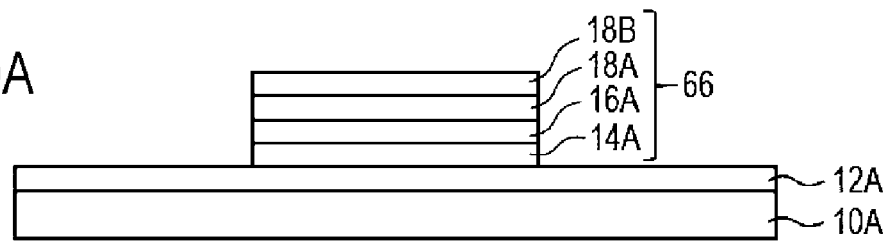
FIG. 10A, FIG. 10B, FIG. 10C, FIG. 10D, and FIG. 10E are process cross-sectional views for illustrating a method of manufacturing the semiconductor light emitting device according to the first embodiment of the present invention.

Subsequently, a part of the AlGaAs layers 14A, 16A, 18A, and 18B is removed by photolithography and dry etching to form the mesa 66 formed of the laminated structure of the AlGaAs layers 14A, 16A, 18A, and 18B as illustrated in FIG. 10A.

Subsequently, for example, a silicon oxide film having a film thickness of 200 nm is deposited by, for example, a chemical vapor deposition (CVD) method. Thus, the insulating film 90 is formed so as to cover the AlGaAs layer 12A exposed by removing the AlGaAs layers 14A, 16A, 18A, and 18B and the upper surface and the side surface of the mesa 66.

Figure 10B:
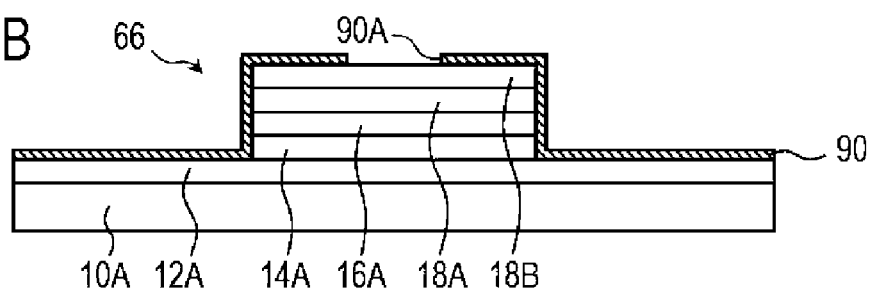

Subsequently, the insulating film 90 is patterned by photolithography and dry etching. Thus, the opening portion 90A reaching the AlGaAs layer 18B is formed in the insulating film 90 as illustrated in FIG. 10B.

Figure 10C:
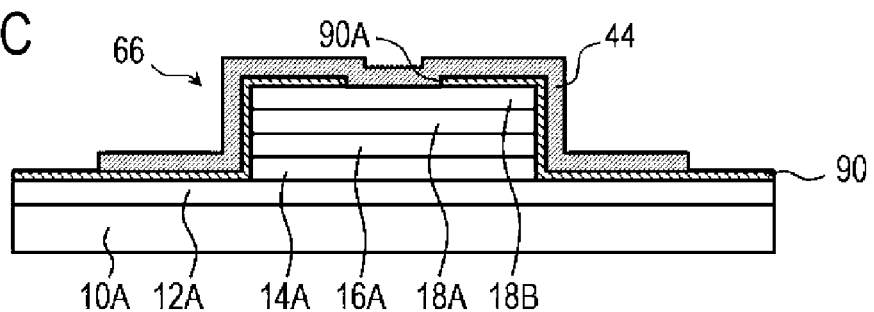

Subsequently, for example, the electrode 44 formed of a laminated structure of a Ti film having a film thickness of 50 nm and an Au film having a film thickness of 200 nm is formed by, for example, a lift-off method. The electrode 44 is formed so as to extend at least from both sides of the mesa 66 along the extending direction of the transfer signal line 74 to the side surface and the upper surface of the mesa 66 as illustrated in FIG. 10C. At this time, another metal layer may be formed between the AlGaAs layer 18B and the electrode 44 in the opening portion 90A to improve contact characteristics between the AlGaAs layer 18B and the electrode 44.

Subsequently, for example, a silicon oxide film having a film thickness of 200 nm is deposited by, for example, a CVD method to form the insulating film 92 covering the electrode 44.

Figure 10D:
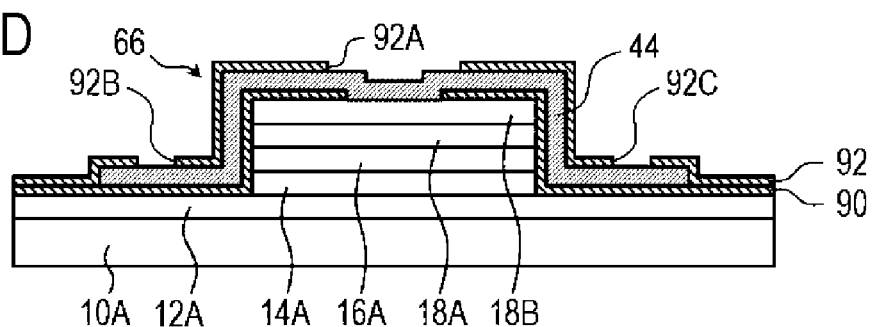

Subsequently, the insulating film 92 is patterned by using photolithography and dry etching. Thus, the opening portion 92A reaching the electrode 44 on the upper surface of the mesa 66 and the opening portions 92B and 92C reaching the electrode 44 on the AlGaAs layers 12A on both sides of the mesa 66 are formed in the insulating film 92 as illustrated in FIG. 10D.

Figure 10E:
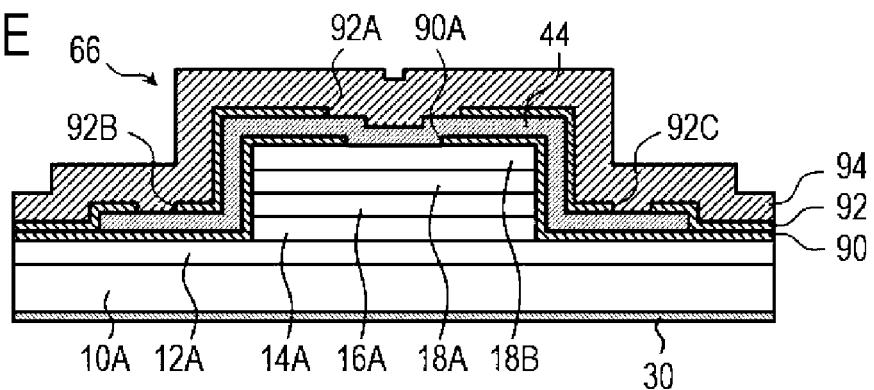

Subsequently, for example, the interconnection 94 formed of a laminated film of a Ti film having a film thickness of 50 nm and an Au film having a film thickness of 1,000 nm is formed by, for example, a lift-off method. In addition, an electrode 30 serving as a cathode electrode of the shift thyristor T is formed on a back surface side of the GaAs substrate 10A as illustrated in FIG. 10E.

In this manner, according to the present embodiment, it is possible to reduce the influence exerted when a crack occurs in the interconnection forming the transfer signal line and to prevent the transfer operation from being stopped at some midpoint. Thus, a semiconductor light emitting device including a highly reliable self-scanning circuit can be achieved.

Second Embodiment

Figure 11:
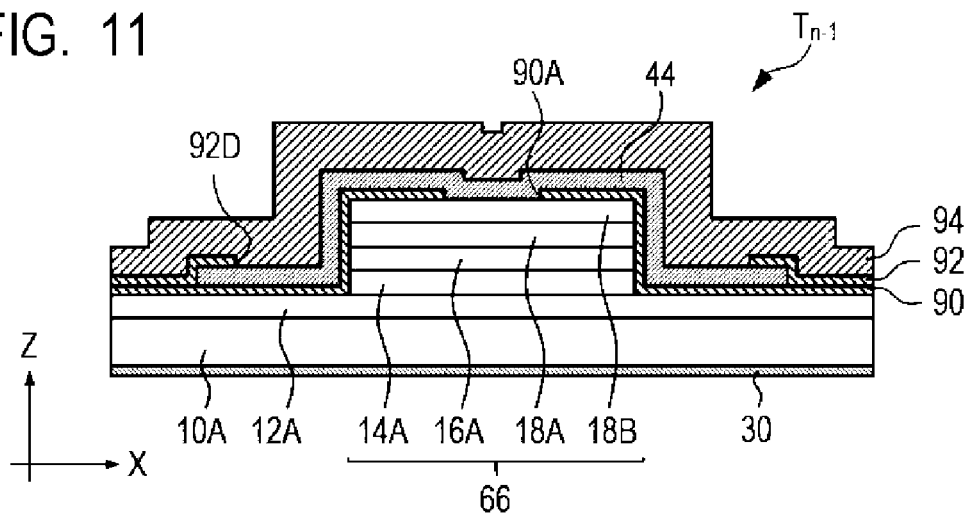
FIG. 11 is a schematic cross-sectional view for illustrating a structure of a shift thyristor in a semiconductor light emitting device according to a second embodiment of the present invention.

A semiconductor light emitting device according to a second embodiment of the present invention will be described with reference to FIG. 11. The same components as those of the semiconductor light emitting device according to the first embodiment are denoted by the same reference symbols, and the description thereof is omitted or simplified. FIG. 11 is a schematic cross-sectional view for illustrating a structure of a shift thyristor in the semiconductor light emitting device according to the present embodiment.

In the first embodiment, the electrode 44 and the interconnection 94 (transfer signal line 74) are electrically connected to each other at three locations through the three opening portions 92B, 92A, and 92C arranged along the extending direction of the transfer signal line 74. However, the connection portion between the electrode 44 and the interconnection 94 may be provided to at least two locations on both sides of the mesa 66, and the number of connection portions between the electrode 44 and the interconnection 94 is not required to be limited. In addition, at least two of those three connecting portions may be connected to each other.

In the semiconductor light emitting device according to the present embodiment, from such a viewpoint, the opening portions 92A, 92B, and 92C in the first embodiment are replaced by one continuous opening portion 92D including a region in which the opening portions 92A, 92B, and 92C are provided. With this configuration, the electrode 44 and the interconnection 94 are in contact with each other over the entire region of the side surface portion and the upper surface portion of the mesa 66, and hence even when a crack occurs in the interconnection 94, no wire break occurs in the transfer signal line 74 at some midpoint. It is also possible to reduce interconnection resistance of the transfer signal line 74 due to an increase in contact area between the electrode 44 and the interconnection 94.

In this manner, according to the present embodiment, it is possible to reduce the influence exerted when a crack occurs in the interconnection forming the transfer signal line and to prevent the transfer operation from being stopped at some midpoint. Thus, a semiconductor light emitting device including a highly reliable self-scanning circuit can be achieved.

Third Embodiment

Figure 12:
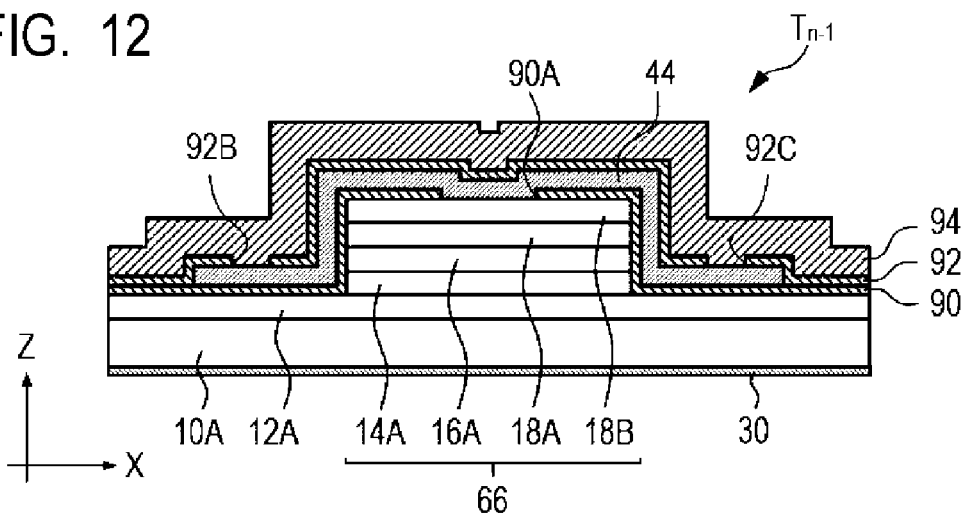
FIG. 12 is a schematic cross-sectional view for illustrating a structure of a shift thyristor in a semiconductor light emitting device according to a third embodiment of the present invention.

A semiconductor light emitting device according to a third embodiment of the present invention will be described with reference to FIG. 12. The same components as those of the semiconductor light emitting device according to the first and second embodiments are denoted by the same reference symbols, and the description thereof is omitted or simplified. FIG. 12 is a schematic cross-sectional view for illustrating a structure of a shift thyristor in the semiconductor light emitting device according to the present embodiment.

From the same viewpoint as that of the second embodiment, the semiconductor light emitting device according to the present embodiment is obtained by omitting the opening portion 92A formed in the upper surface of the mesa 66 from the semiconductor light emitting device according to the first embodiment. In a configuration of the present embodiment as well, the electrical connection between both sides of the mesa 66 can be maintained by the electrode 44, and hence even when a crack occurs in the interconnection 94, no wire break occurs in the transfer signal line 74 at some midpoint.

The configuration of the present embodiment also has an advantage that the reliability in contact between the AlGaAs layer 18B and the electrode 44 can be improved.

When a semiconductor and a metal are in contact with each other, a failure may occasionally occur during a photoresist development process. For example, a weak alkaline developing solution is often used for developing a photoresist, but this developing solution may cause a phenomenon (electrolytic corrosion) of corroding a contact portion between a semiconductor and a metal. For example, in the configurations of the first and second embodiments, there is a fear in that the contact portion between the AlGaAs layer 18B and the electrode 44 may be damaged by electrolytic corrosion during a photolithography process when the opening portions 92A, 92B, 92C, and 92D are formed in the insulating film 92.

In this regard, in the present embodiment, the opening portion 92A and the opening portion 92D for connecting the electrode 44 and the interconnection 94 are not formed in the upper surface of the mesa 66, and hence the contact portion between the AlGaAs layer 18B and the electrode 44 is protected by the insulating film 92. Therefore, according to the configuration of the present embodiment, the contact portion between the AlGaAs layer 18B and the electrode 44 can be prevented from being damaged by electrolytic corrosion, to thereby be able to improve reliability in contact between the AlGaAs layer 18B and the electrode 44.

In this manner, according to the present embodiment, it is possible to reduce the influence exerted when a crack occurs in the interconnection forming the transfer signal line and to prevent the transfer operation from being stopped at some midpoint. Thus, a semiconductor light emitting device including a highly reliable self-scanning circuit can be achieved.

Fourth Embodiment

Figure 13:
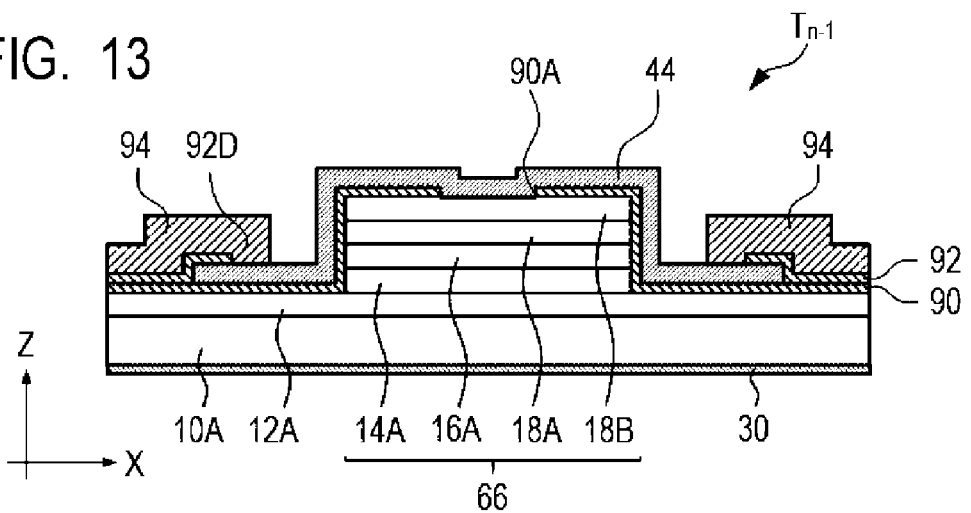
FIG. 13 is a schematic cross-sectional view for illustrating a structure of a shift thyristor in a semiconductor light emitting device according to a fourth embodiment of the present invention.

A semiconductor light emitting device according to a fourth embodiment of the present invention will be described with reference to FIG. 13. The same components as those of the semiconductor light emitting device according to the first to third embodiments are denoted by the same reference symbols, and the description thereof is omitted or simplified. FIG. 13 is a schematic cross-sectional view for illustrating a structure of a shift thyristor in the semiconductor light emitting device according to the present embodiment.

The present embodiment is a configuration example in which the interconnection 94 is divided in the portion in which the interconnection 94 straddles the mesa 66. In a configuration of the present embodiment as well, the electrical connection between both sides of the mesa 66 can be maintained by the electrode 44, and hence the interconnection 94 is not required to be formed so as to straddle the mesa 66.

In addition, in the configuration of the present embodiment, the electrode 44 and the interconnection 94 do not overlap each other at the corner portion of the mesa 66, and hence even when the stress of the interconnection 94 is increased by thickening the interconnection 94, this stress does not exert an influence on the electrode 44. This can prevent such a failure that a crack occurs in the electrode 44.

In FIG. 13, the configuration example in which the present embodiment is applied to the configuration of the second embodiment is illustrated, but it is also possible to apply the configuration of the present embodiment to the configuration of the third embodiment.

In this manner, according to the present embodiment, it is possible to prevent a crack from occurring in the interconnection forming the transfer signal line and to prevent the transfer operation from being stopped at some midpoint. Thus, a semiconductor light emitting device including a highly reliable self-scanning circuit can be achieved.

Fifth Embodiment

Figure 14A:
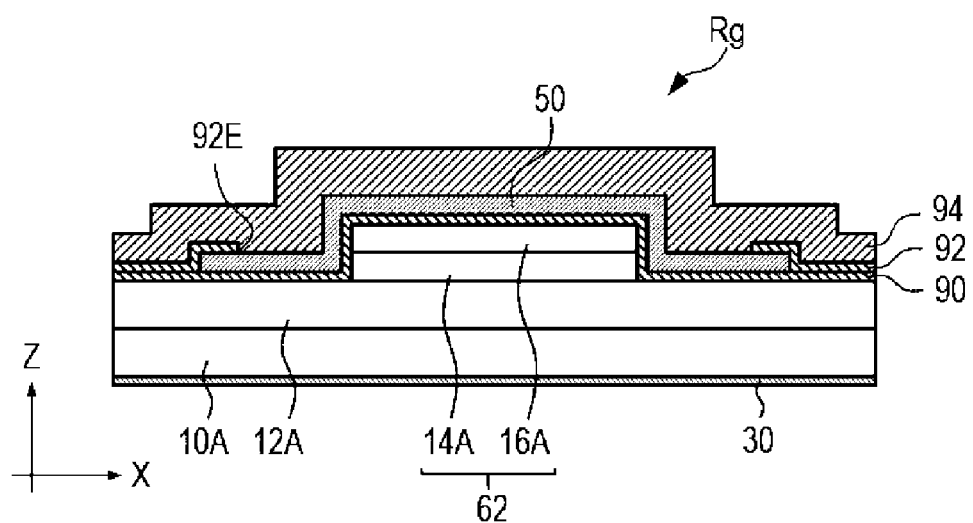
FIG. 14A and FIG. 14B are schematic cross-sectional views for illustrating a structure of a shift thyristor in a semiconductor light emitting device according to a fifth embodiment of the present invention.
Figure 14B:
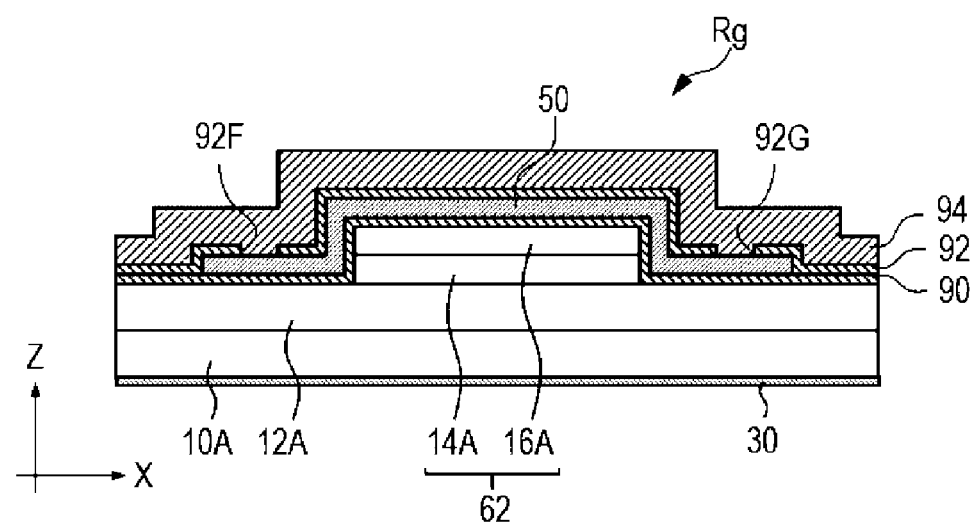

A semiconductor light emitting device according to a fifth embodiment of the present invention will be described with reference to FIG. 14A and FIG. 14B. The same components as those of the semiconductor light emitting device according to the first to fourth embodiments are denoted by the same reference symbols, and the description thereof is omitted or simplified. FIG. 14A and FIG. 14B are schematic cross-sectional views for illustrating a structure of a shift thyristor in the semiconductor light emitting device according to the present embodiment.

The first to fourth embodiments have been described so far with attention being given to the portions in which the transfer signal lines 74 and 76 straddle the mesa 66 forming the shift thyristor T, but as illustrated in FIG. 3, the transfer signal line 74 is also configured to straddle the mesa 62 forming the gate resistor Rg. Therefore, the configuration of the shift thyristor T portion described in the first to fourth embodiments so far can also be applied to the gate resistor Rg portion.

An intersecting portion between the mesa 62 and the transfer signal lines 74 is different from an intersecting portion between the mesa 66 and each of the transfer signal lines 74 and 76 in that the mesa 62 and the transfer signal lines 74 are not electrically connected to each other. Therefore, the electrode corresponding to the electrode 44 of the mesa 66 portion is basically not required in the intersecting portion between the mesa 62 and the transfer signal line 74, but in the present embodiment, an electrode 50 corresponding to the electrode 44 of the mesa 66 portion is intentionally arranged in the intersecting portion between the mesa 62 and the transfer signal line 74.

That is, in the present embodiment, as illustrated in FIG. 14A and FIG. 14B, in the same manner as in the electrode 44 in the mesa 66 portion, the electrode 50 is arranged so as to extend to the side surface and the upper surface of the mesa 62 from both sides of the mesa 62 along the extending direction (X direction) of the transfer signal line 74. The electrode 50 and the mesa 62 are insulated from each other by the insulating film 90. Then, the electrode 50 and the transfer signal line 74 formed in its upper layer are electrically connected to each other.

In a configuration example illustrated in FIG. 14A, in the same manner as in the case of the second embodiment, an opening portion 92E for exposing the electrode 50 is formed in the insulating film 92 in a portion extending from both sides of the mesa 62 along the extending direction (X direction) of the transfer signal line 74 to the side surface and the upper surface of the mesa 62. Then, the electrode 50 and the transfer signal line 74 are electrically connected to each other through the opening portion 92E. In a configuration example illustrated in FIG. 14B, in the same manner as in the case of the third embodiment, opening portions 92F and 92G for exposing the electrode 50 are formed in the insulating film 92 in portions positioned on both sides of the mesa 62. Then, the electrode 50 and the transfer signal line 74 are electrically connected to each other through the opening portions 92F and 92G.

Therefore, according to the above-mentioned configuration of the present embodiment, even when a crack occurs in the transfer signal line 74 in the portion in which the transfer signal line 74 straddles the mesa 62, no wire break occurs in the signal line forming the transfer signal line 74 at some midpoint.

It is possible to apply the above-mentioned configuration of the present embodiment to an intersecting portion between the transfer signal line 76 and the interconnection 78 in FIG. 3.

In this manner, according to the present embodiment, it is possible to reduce the influence exerted when a crack occurs in the interconnection forming the transfer signal line and to prevent the transfer operation from being stopped at some midpoint. Thus, a semiconductor light emitting device including a highly reliable self-scanning circuit can be achieved.

Sixth Embodiment

Figure 15:
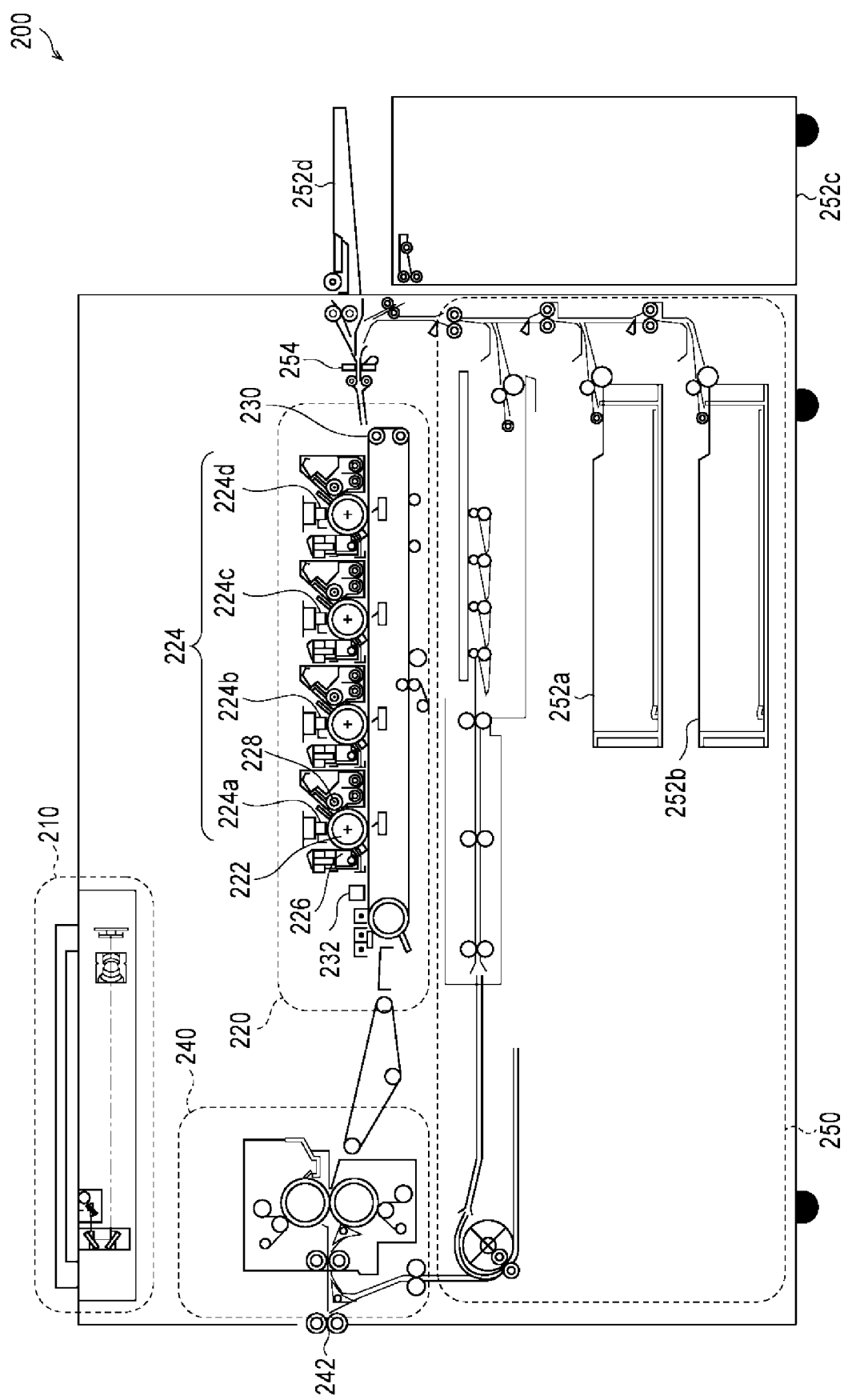
FIG. 15 is a schematic view for illustrating a configuration example of an image forming apparatus according to a sixth embodiment of the present invention.
Figure 16A:
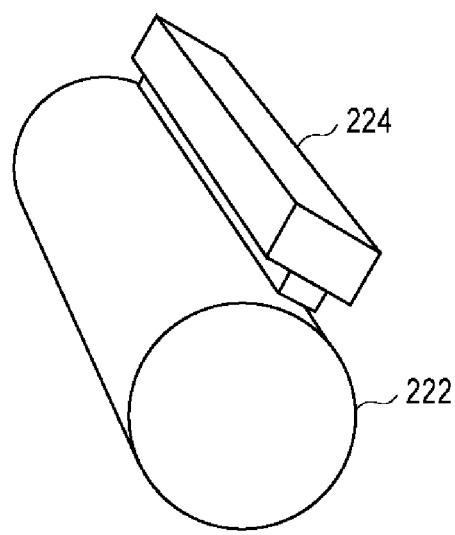
FIG. 16A and FIG. 16B are schematic views for illustrating a configuration example of an exposure head of the image forming apparatus according to the sixth embodiment of the present invention.
Figure 16B:
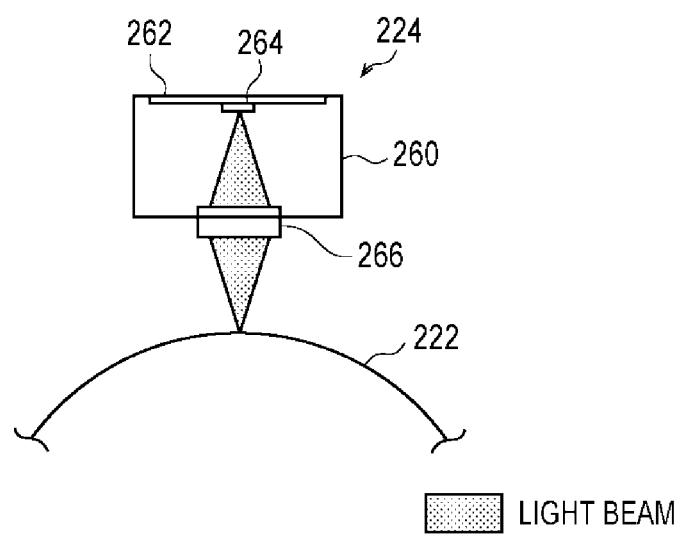
Figure 17A:
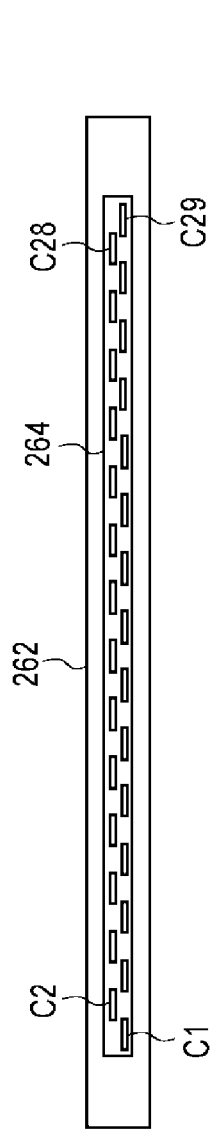
FIG. 17A, FIG. 17B, and FIG. 17C are schematic views for illustrating a surface emitting element array chip group of the image forming apparatus according to the sixth embodiment of the present invention.
Figure 17B:
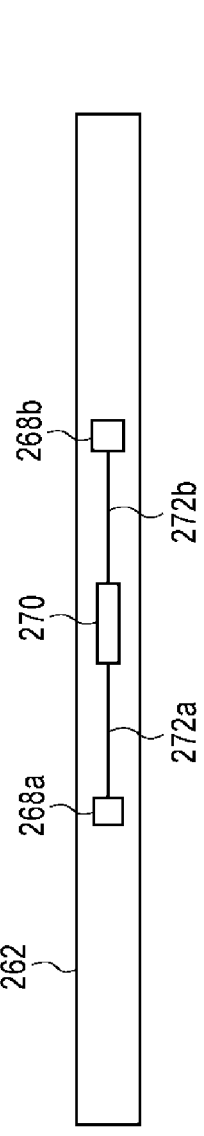
Figure 17C:
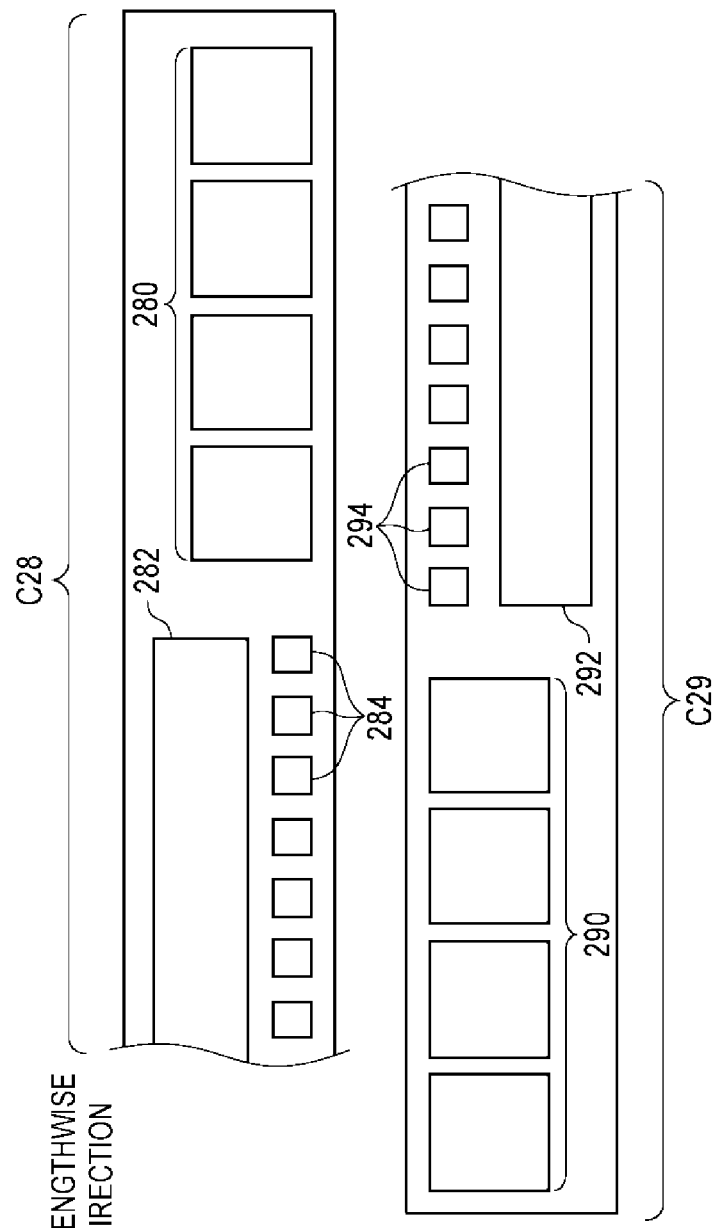

An image forming apparatus according to a sixth embodiment of the present invention will be described with reference to FIG. 15 to FIG. 17C. The same components as those of the semiconductor light emitting device according to the first to fifth embodiments are denoted by the same reference symbols, and the description thereof is omitted or simplified. FIG. 15 is a schematic view for illustrating a configuration example of the image forming apparatus according to the present embodiment. FIG. 16A and FIG. 16B are schematic views for illustrating a configuration example of an exposure head of the image forming apparatus according to the present embodiment. FIG. 17A to FIG. 17C are schematic views for illustrating a surface emitting element array chip group of the image forming apparatus according to the present embodiment.

The semiconductor light emitting device 100 described as each of the first to fifth embodiments can be applied to various electronic devices, for example, image forming apparatus including an image scanner, a copying machine, and a facsimile machine. In the present embodiment, an electrophotographic image forming apparatus is described as an example of the electronic devices using the semiconductor light emitting device 100 according to each of the first to third embodiments.

As illustrated in FIG. 15, an image forming apparatus 200 according to the present embodiment includes a scanner unit 210, an image forming unit 220, a fixing unit 240, a feeding/conveying unit 250, and an image formation control unit (not shown) configured to control the above-mentioned units.

The scanner unit 210 is configured to illuminate an original placed on an original table, optically read an image on the original, and convert the image into an electrical signal to create image data.

The image forming unit 220 includes a plurality of developing units configured to perform development through use of an electrophotographic process. The developing units include a photosensitive drum 222, an exposure head 224, a charging device 226, and a developing device 228. The developing unit may be a process cartridge including a configuration used for developing a toner image. In this case, it is preferred that the process cartridge be removably mounted to a main body of the image forming apparatus.

The photosensitive drum 222 is an image bearing member on which an electrostatic latent image is to be formed. The photosensitive drum 222 is configured to be rotationally driven and charged by the charging device 226.

The exposure head 224 is configured to irradiate the photosensitive drum 222 with light corresponding to the image data to form an electrostatic latent image on the photosensitive drum 222.

The developing device 228 is configured to supply toner (developer) to the electrostatic latent image formed on the photosensitive drum 222 to develop the toner image. The toner is stored in a containing portion. It is preferred that the containing portion configured to store toner be included in the developing unit. The developed toner image (developer image) is transferred onto a recording medium, for example, a paper sheet conveyed on a transfer belt 230.

The image forming apparatus according to the present embodiment includes four developing units (developing stations) configured to perform development by a series of electrophotographic processes, and is configured to form a desired image by transferring a toner image from each developing unit. The four developing units have toners of different colors. Specifically, the four developing units arranged in the order of cyan (C), magenta (M), yellow (Y), and black (K) sequentially execute image formation operations so as to start the image formation operation for cyan first, then start the image formation operation for magenta a predetermined time after the start of the image formation operation for cyan, then start the image formation operation for yellow the predetermined time after the start of the image formation operation for magenta, and then start the image formation operation for black the predetermined time after the start of the image formation operation for yellow.

The feeding/conveying unit 250 is configured to feed a paper sheet from a sheet feeding unit designated in advance from among sheet feeding units 252a and 252b in the main body, an external sheet feeding unit 252c, and a manual sheet feeding unit 252d. The fed paper sheet is conveyed to registration rollers 254.

The registration rollers 254 are configured to convey the paper sheet onto the transfer belt 230 so that the toner image formed in the image forming unit 220 described above is transferred onto the paper sheet.

An optical sensor 232 is arranged so as to face a surface of the transfer belt 230 onto which the toner image is to be transferred, and is configured to perform position detection of a test chart printed on the transfer belt 230 in order to derive a color shift amount between the developing units. The color shift amount derived above is sent to an image controller unit (not shown) to be used for correcting an image position of each color. This control enables a full-color toner image to be transferred onto the paper sheet without a color drift.

The fixing unit 240 includes a plurality of rollers and a heat source, for example, a halogen heater, and is configured to melt and fix, by heat and pressure, the toner to the paper sheet on which the toner image has been transferred from the transfer belt 230, and to deliver the paper sheet to the outside of the image forming apparatus 200 by a delivery roller 242.

The image formation control unit (not shown) is connected to an MFP control unit configured to control an entire multifunction peripheral (MFP) including the image forming apparatus, and is configured to execute control in response to an instruction from the MFP control unit. The image formation control unit is also configured to issue an instruction so that the entirety can operate smoothly in harmony while managing the states of the scanner unit 210, the image forming unit 220, the fixing unit 240, and the feeding/conveying unit 250 that are described above.

The exposure head 224 of the image forming apparatus according to the present embodiment is described with reference to FIG. 16A and FIG. 16B. FIG. 16A is an illustration of how the exposure head 224 is arranged with respect to the photosensitive drum 222. FIG. 16B is an illustration of a state in which light emitted from the exposure head 224 is imaged on a surface of the photosensitive drum 222.

As illustrated in FIG. 16A, the exposure head 224 is arranged so as to be opposed to the photosensitive drum 222. Each of the exposure head 224 and the photosensitive drum 222 is used by being mounted to the image forming apparatus 200 by a mounting member (not shown).

As illustrated in FIG. 16B, the exposure head 224 includes a surface emitting element array chip group 264, a printed circuit board 262 to which the surface emitting element array chip group 264 is mounted, and a rod lens array 266. The exposure head 224 also includes a housing (support member) 260 configured to support the rod lens array 266 and the printed circuit board 262.

The rod lens array 266 is an optical system configured to condense light emitted from the surface emitting element array chip group 264. The exposure head 224 is configured to condense light generated from chip surfaces of the surface emitting element array chip group 264 onto the photosensitive drum 222 by the rod lens array 266 to form an electrostatic latent image corresponding to image data on the photosensitive drum 222.

It is preferred that the exposure head 224 be individually assembled and adjusted in a factory, and have the focus and light amount at each spot adjusted so that the focused position of the light becomes an appropriate position when the exposure head 224 is mounted to the image forming apparatus. In this case, the photosensitive drum 222, the surface emitting element array chip group 264, and the rod lens array 266 are arranged so that a distance between the photosensitive drum 222 and the rod lens array 266 and a distance between the rod lens array 266 and the surface emitting element array chip group 264 each become equal to a predetermined interval. Thus, the light emitted from the exposure head 224 is imaged on the photosensitive drum 222. Therefore, at a time of focus adjustment, the mounted position of the rod lens array 266 is adjusted so that the distance between the rod lens array 266 and the surface emitting element array chip group 264 has a desired value. Meanwhile, at a time of light amount adjustment, light emitting points are sequentially caused to emit light to adjust drive currents for the light emitting points so that the light condensed through the rod lens array 266 has a predetermined light amount.

The exposure head 224 in the present embodiment can be suitably used for exposing the photosensitive drum 222 to form an electrostatic latent image on the photosensitive drum 222. However, the application of the exposure head 224 is not particularly limited, and the exposure head 224 can also be used as, for example, a light source of a line scanner.

The surface emitting element array chip group 264 of the image forming apparatus according to the present embodiment is described with reference to FIG. 17A to FIG. 17C. FIG. 17A to FIG. 17C are schematic views for illustrating the printed circuit board 262 in which the surface emitting element array chip group 264 is arranged.

FIG. 17A is a schematic illustration of a surface (hereinafter referred to as "surface emitting element array mounted surface") on which the surface emitting element array chip group 264 is mounted, of the printed circuit board 262 in which the surface emitting element array chip group 264 is arranged.

As illustrated in FIG. 17A, the surface emitting element array chip group 264 is formed of 29 surface emitting element array chips C1 to C29 in the present embodiment. The surface emitting element array chip group 264 is mounted on the surface emitting element array mounted surface of the printed circuit board 262. The surface emitting element array chips C1 to C29 are arranged in two rows in a staggered pattern on the printed circuit board 262. The surface emitting element array chips C1 to C29 are each arranged along a lengthwise direction of the printed circuit board 262.

The surface emitting element array chips C1 to C29 can each be formed of the semiconductor light emitting device 100 described in any one of the first to third embodiments. The surface emitting element array chips C1 to C29 each include 516 light emitting points and 516 light emitting thyristors L respectively corresponding to the light emitting points. In each of the surface emitting element array chips C1 to C29, the 516 light emitting thyristors L are one-dimensionally arranged at a predetermined pitch in a lengthwise direction of the chip. The adjacent light emitting thyristors L are separated by an element separation groove. That is, the surface emitting element array chips C1 to C29 can also be called "light emitting thyristor array" in which a plurality of light emitting thyristors L are one-dimensionally arranged. In the present embodiment, a pitch of the adjacent light emitting thyristors is 21.16 µm, which corresponds to a pitch for a resolution of 1,200 dpi. Further, an interval from one end to the other end of the 516 light emitting points in the chip is about 10.9 mm (~21.16 µm×516).

FIG. 17B is a view for schematically illustrating a surface (hereinafter referred to as "surface emitting element array non-mounted surface") of the printed circuit board 262 opposite to the surface emitting element array mounted surface.

As illustrated in FIG. 17B, on the surface emitting element array non-mounted surface, a drive unit 268a configured to drive the surface emitting element array chips C1 to C15 and a drive unit 268b configured to drive the surface emitting element array chips C16 to C29 are arranged on both sides of a connector 270. The connector 270 is connected to a power supply, a ground line, and a signal line for controlling the drive units 268a and 268b from the image controller unit (not shown). The connector 270 is also connected to the drive units 268a and 268b on the surface emitting element array non-mounted surface through interconnections 272a and 272b, respectively. From the drive units 268a and 268b, interconnections for driving the surface emitting element array chips pass through an inner layer of the printed circuit board 262 to be connected to the surface emitting element array chips C1 to C15 and the surface emitting element array chips C16 to C29, respectively.

FIG. 17C is an illustration of a state of a boundary portion between the surface emitting element array chip C28 and the surface emitting element array chip C29.

Wire bonding pads 280 and 290 for inputting control signals are arranged at end portions of the surface emitting element array chips C28 and C29, respectively. Transfer units 282 and 292 and the light emitting thyristors 284 and 294 of the surface emitting element array chips C28 and C29 are driven in response to signals input from the wire bonding pads 280 and 290, respectively. Even in the boundary portion between the surface emitting element array chips, the pitch of the light emitting thyristors 284 and 294 in a lengthwise direction is 21.16 μm, which corresponds to the pitch for the resolution of 1,200 dpi. In consideration of chip mounting accuracy, the light emitting thyristors of the chips may be arranged so as to overlap each other.

On the printed circuit board 262, the 29 surface emitting element array chips C1 to C29 each including 516 light emitting points are arranged, and hence the number of light emitting thyristors L that can be caused to emit light is 14,964 in the entire surface emitting element array chip group 264. In addition, a width by which exposure can be performed by the surface emitting element array chip group 264 in the present embodiment is about 316 mm (~10.9 mm×29). An image corresponding to this width can be formed through use of the exposure head to which the surface emitting element array chip group 264 is mounted.

The image forming apparatus according to the present embodiment uses a smaller number of parts than a laser scanning type image forming apparatus in which a laser beam is deflected and scanned by a polygon motor, and hence it is easy to reduce the size and cost of the apparatus.

Modified Embodiment

The present invention is not limited to the above-mentioned embodiments, and various modifications can be made.

For example, the present invention includes, as its embodiment, an example in which part of the configuration of any of the embodiments is added to another embodiment or is replaced with part of the configuration of another embodiment.

Further, in the above-mentioned embodiments, the transfer diode D and the gate resistor Rg are provided to different mesas, but may be provided to the same mesa. Further, in the above-mentioned embodiments, the shift thyristor T and the light emitting thyristor L are provided to different mesas, but may be provided to the same mesa. Suitable examples thereof include structures with the mesa having a large difference in level, for example, a structure in which a light emitting element is laminated on a shift thyristor and a structure in which a shift thyristor is laminated on a light emitting element.

Further, in the above-mentioned embodiments, one shift thyristor T is connected to one or four light emitting thyristors L to enable the one or four light emitting thyristors L to be lit simultaneously, but the number of light emitting thyristors L that can be lit simultaneously is not limited thereto.

Further, in the above-mentioned embodiments, the shift thyristor T and the light emitting thyristor L have been described by taking n-gate type thyristors as an example, but may be formed of p-gate type thyristors. In this case, it suffices to invert the conductivity types of the semiconductor layers forming the shift thyristor T, the light emitting thyristor L, and the transfer diode D.

Further, in the above-mentioned embodiments, as a III-V group compound semiconductor forming the semiconductor light emitting device, a GaAs-based compound semiconductor material containing at least Ga as a group III element and at least As as a group V element has been described as an example. However, an InP-based compound semiconductor material containing at least In as a group III element and at least P as a group V element may be used as the group III-V compound semiconductor forming the semiconductor light emitting device. Not only the III-V group compound semiconductor but also a IV group semiconductor or a II-VI group compound semiconductor may be used to form the semiconductor light emitting device. In addition, the composition, thickness, impurity concentration, and other such factors of the material for forming the semiconductor layer described in the above-mentioned embodiments are suitable examples, and can be appropriately changed.

Further, when the transfer diode portion, the shift thyristor portion, and the light emitting thyristor portion are integrated on the same substrate, a distributed Bragg reflection layer (DBR layer) may be provided between the GaAs substrate 10A and the AlGaAs layer 12A in order to increase the light output from the light emitting thyristor L. The DBR layer can be formed by, for example, alternately laminating an AlGaAs layer having a high Al composition and an AlGaAs layer having a low Al composition so that each layer has an optical length of λ/4. As a combination of the AlGaAs layer having a high Al composition and the AlGaAs layer having a low Al composition, for example, $Al_{0.8}Ga_{0.2}As$ and $Al_{0.2}Ga_{0.8}As$ or $Al_{0.9}Ga_{0.1}As$ and $Al_{0.1}Ga_{0.09}As$ can be employed. As the total number of DBR layers increases, the reflectance can be increased, and hence it is preferred to form a laminated body of about 20 layers or more.

Further, the AlGaAs layer 16A and the AlGaAs layer 14A, which serve as light emitters, may be formed as a multiple quantum well (MQW) structure in order to increase the light emission efficiency of the light emitting thyristor L.

Further, the image forming apparatus described above in the sixth embodiment is an example of the image forming apparatus to which the semiconductor light emitting device according to the present invention can be applied, and the image forming apparatus to which the semiconductor light emitting device according to the present invention can be applied is not limited to the configuration illustrated in FIG. 15. Further, the semiconductor light emitting device according to the present invention can be applied not only to the image forming apparatus but also to various electronic devices using the semiconductor light emitting device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-173829, filed Sep. 25, 2019 which is hereby incorporated by reference herein in its entirety.

What is claimed is:
1. A semiconductor light emitting device comprising:
a plurality of nodes each connected to a gate of a shift thyristor and a gate of a light emitting thyristor; and
a plurality of transfer diodes arranged so as to connect the plurality of nodes to each other,
wherein the shift thyristor has a laminated structure including a plurality of semiconductor layers, and is provided to a mesa formed separately from the light emitting thyristor and each of the plurality of transfer diodes, wherein the shift thyristor includes:
- a first metal layer continuously provided so as to straddle the mesa; and
- a second metal layer, which is arranged above the first metal layer, and includes a first part and a second part arranged so as to be opposed to the first part across the mesa, and wherein the first part and the second part of the second metal layer are each electrically connected to the first metal layer in a region that does not overlap the mesa in a plan view.

2. The semiconductor light emitting device according to claim 1, further comprising a first insulating film, which is arranged between the mesa and the first metal layer, and has a first opening portion formed in an upper surface portion of the mesa so as to electrically connect the mesa and the first metal layer to each other.

3. The semiconductor light emitting device according to claim 1, further comprising a first insulating film arranged between the mesa and the first metal layer, wherein the mesa and the first metal layer are insulated from each other by the first insulating film.

4. The semiconductor light emitting device according to claim 1, further comprising a second insulating film, which is arranged between the first metal layer and the second metal layer, and has a second opening portion formed so as to electrically connect the first metal layer and the first part to each other and a third opening portion formed so as to electrically connect the first metal layer and the second part to each other.

5. The semiconductor light emitting device according to claim 4, wherein the second metal layer further includes a third part, which is arranged so as to straddle the mesa, and extends continuously from the first part and the second part.

6. The semiconductor light emitting device according to claim 4, wherein the second opening portion and the third opening portion form one opening portion continuously provided so as to straddle the mesa.

7. The semiconductor light emitting device according to claim 5, wherein the second insulating film further has a fourth opening portion formed in an upper surface portion of the mesa so as to electrically connect the first metal layer and the third part to each other.

8. The semiconductor light emitting device according to claim 1, wherein the second metal layer is thicker than the first metal layer.

9. The semiconductor light emitting device according to claim 1, wherein the second metal layer forms at least one part of a transfer signal line for supplying the shift thyristor with a transfer signal for controlling a transfer operation for an on state.

10. A semiconductor device comprising:
a mesa having a plurality of semiconductor layers;
a first metal layer continuously provided so as to straddle the mesa; and
a second metal layer, which is arranged above the first metal layer, and includes a first part and a second part arranged so as to be opposed to the first part across the mesa, wherein the first part and the second part of the second metal layer are each electrically connected to the first metal layer in a region that does not overlap the mesa in a plan view.

11. The semiconductor device according to claim 10, further comprising a first insulating film, which is arranged between the mesa and the first metal layer, and has a first opening portion formed in an upper surface portion of the mesa so as to electrically connect the mesa and the first metal layer to each other.

12. The semiconductor device according to claim 10, further comprising a first insulating film arranged between the mesa and the first metal layer, wherein the mesa and the first metal layer are insulated from each other by the first insulating film.

13. The semiconductor device according to claim 10, further comprising a second insulating film, which is arranged between the first metal layer and the second metal layer, and has a second opening portion formed so as to electrically connect the first metal layer and the first part to each other and a third opening portion formed so as to electrically connect the first metal layer and the second part to each other.

14. The semiconductor device according to claim 13, wherein the second metal layer further includes a third part, which is arranged so as to straddle the mesa, and extends continuously from the first part and the second part.

15. The semiconductor device according to claim 13, wherein the second opening portion and the third opening portion form one opening portion continuously provided so as to straddle the mesa.

16. The semiconductor device according to claim 14, wherein the second insulating film further has a fourth opening portion formed in an upper surface portion of the mesa so as to electrically connect the first metal layer and the third part to each other.

17. The semiconductor device according to claim 10, wherein the second metal layer is thicker than the first metal layer.

18. An exposure head comprising:
the semiconductor light emitting device of claim 1; and
an optical system configured to condense light emitted from the semiconductor light emitting device.

19. An image forming apparatus comprising:
an image bearing member;
a charging unit configured to charge a surface of the image bearing member;
an exposure head, which includes the semiconductor light emitting device of claim 1, and is configured to expose the surface of the image bearing member charged by the charging unit to form an electrostatic latent image on the surface of the image bearing member;
a developing unit configured to develop the electrostatic latent image formed by the exposure head; and
a transfer unit configured to transfer the image developed by the developing unit onto a recording medium.

* * * * *